(12) United States Patent
Kim

(10) Patent No.: US 9,844,952 B2
(45) Date of Patent: Dec. 19, 2017

(54) IMAGE FORMING APPARATUS FOR DETERMINING DEFECTS OF LIGHT-EMITTING ELEMENT ARRAY CHIPS

(71) Applicant: Samsung Electronics Co., Ltd., Suwon-si (KR)

(72) Inventor: Su-hwan Kim, Suwon-si (KR)

(73) Assignee: S-PRINTING SOLUTION CO., LTD., Suwon-si (KR)

( * ) Notice: Subject to any disclaimer, the term of this patent is extended or adjusted under 35 U.S.C. 154(b) by 71 days.

(21) Appl. No.: 14/681,405

(22) Filed: Apr. 8, 2015

(65) Prior Publication Data

US 2016/0001575 A1  Jan. 7, 2016

(30) Foreign Application Priority Data

Jul. 7, 2014  (KR) .................. 10-2014-0084620

(51) Int. Cl.
*G01J 1/58* (2006.01)
*B41J 2/45* (2006.01)
(Continued)

(52) U.S. Cl.
CPC ............... *B41J 2/45* (2013.01); *G01R 31/44* (2013.01); *G03G 15/04054* (2013.01); *H04N 1/036* (2013.01)

(58) Field of Classification Search
CPC  G01R 31/2853; G01R 31/2896; G01R 31/26; G01R 31/2601; G01R 31/2856; G01R 31/318513; G01R 31/2621; G01R 31/2884; G01R 31/2889; G01R 1/0491; G01R 27/02; G01R 31/025;
(Continued)

(56) References Cited

U.S. PATENT DOCUMENTS 4,204,130 A * 5/1980 Harris ................. H01L 27/0821
                                              257/567
4,524,320 A * 6/1985 Brooks ................ G01R 31/023
                                              324/542
(Continued)

FOREIGN PATENT DOCUMENTS

CN  101654022      2/2010
CN  202 695 393 U  1/2013
(Continued)

OTHER PUBLICATIONS

International Search Report dated Aug. 10, 2015 issued in corresponding PCT Application PCT/KR2015/004458.
(Continued)

*Primary Examiner* — Taqi Nasir
(74) *Attorney, Agent, or Firm* — Staas & Halsey LLP

(57) ABSTRACT

An image forming apparatus includes a plurality of light-emitting element array chips including a light-emitting element array and a transfer element array, and a control driver applying a signal to the plurality of light-emitting element array chips. The control driver includes a check terminal that measures signals output from the plurality of light-emitting element array chips, and the control driver determines whether any of the plurality of light-emitting element array chips are defective by analyzing the signals measured at the check terminal.

16 Claims, 32 Drawing Sheets

(51) Int. Cl.
    *G01R 31/44* (2006.01)
    *G03G 15/04* (2006.01)
    *H04N 1/036* (2006.01)

(58) Field of Classification Search
    CPC .. G01R 19/0084; G01R 19/165; G01R 27/14;
        G01R 31/024; B41J 29/38; B41J 2/2142;
        B41J 2/16579; B41J 2/2146; B41J
        2/0451; G03G 15/04054; G03G 21/1666;
        G03G 15/04; G03G 15/043
    USPC .... 324/760.01, 719, 760.02, 762.03, 762.05,
        324/414, 409, 412, 500, 501, 512, 522,
        324/523, 525, 537, 555, 76.11, 96, 97,
        324/98, 600, 602, 605, 606, 629, 647,
        324/691, 705; 399/4, 130, 177, 220;
        347/19
    See application file for complete search history.

(56)         References Cited

U.S. PATENT DOCUMENTS 8,350,876  B2    1/2013   Yoshikawa et al.
    2005/0263718  A1  12/2005  Tsujino et al.
    2009/0289559  A1*  11/2009  Tanaka ............... H05B 33/0827
                                                        315/185 R
    2010/0045763  A1*  2/2010   Tsuchiya ................. B41J 2/451
                                                        347/130
    2012/0049740  A1*  3/2012   Kang ................... H05B 33/089
                                                        315/121

FOREIGN PATENT DOCUMENTS

JP      2000-255101  A      9/2000
    JP      2004-296782         10/2004
    JP      2004296782   A  *  10/2004  ............. H01L 33/00
    JP      2005-329659         12/2005
    JP      2005329659   A  *  12/2005  ............... B41J 2/44
    JP      2011-24004          2/2011
    KR      10-2005-0113701    12/2005
    KR      20050113701  A  *  12/2005  ............. G09G 3/30

OTHER PUBLICATIONS

European Search Report dated Nov. 13, 2015 issued in corresponding European Patent Application 15168497.4.
Chinese Office Action dated Oct. 10, 2017 from Chinese Patent Application No. 201510395275.4, 19 pages.

* cited by examiner

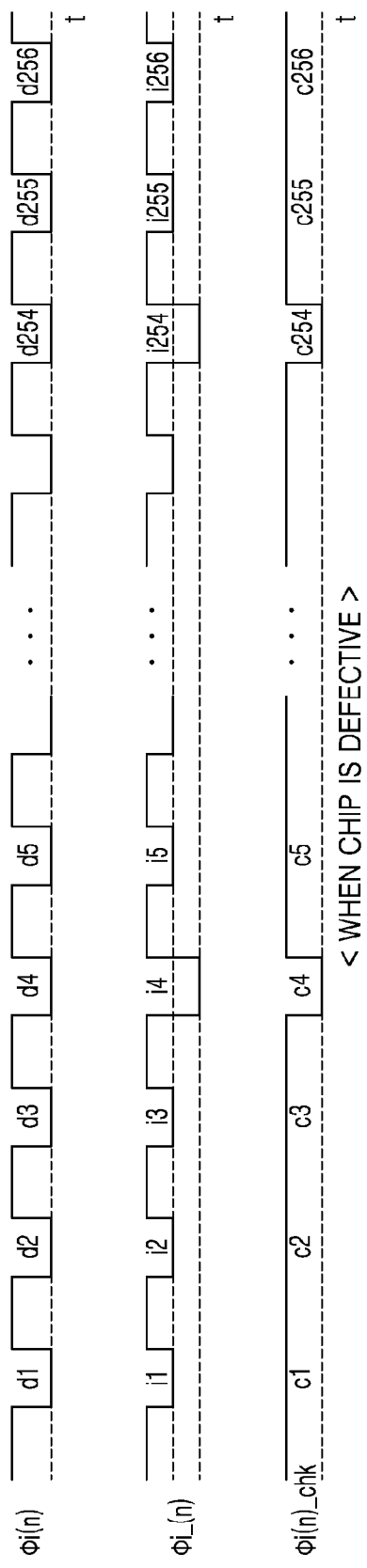

< WHEN CHIP IS NORMAL >

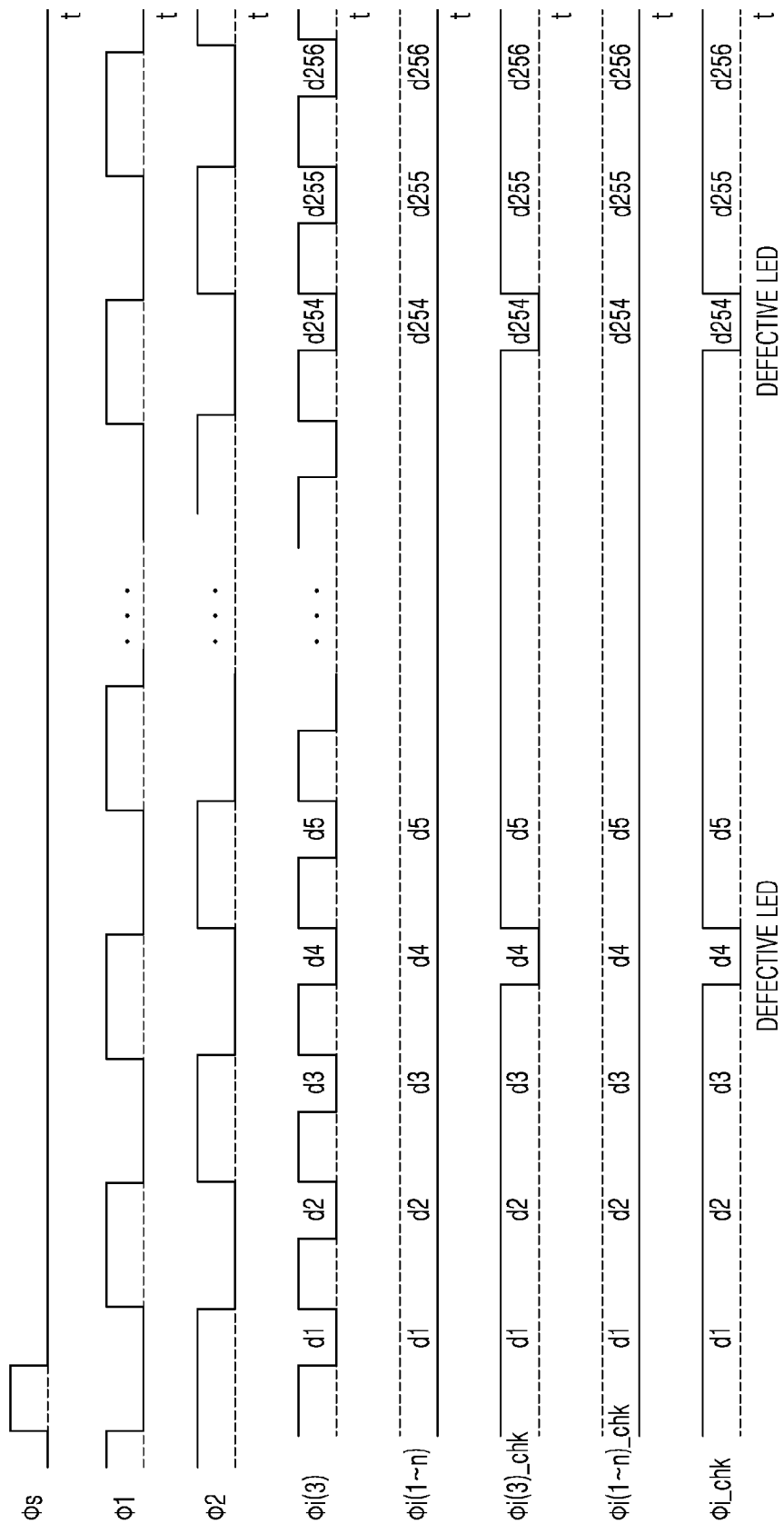

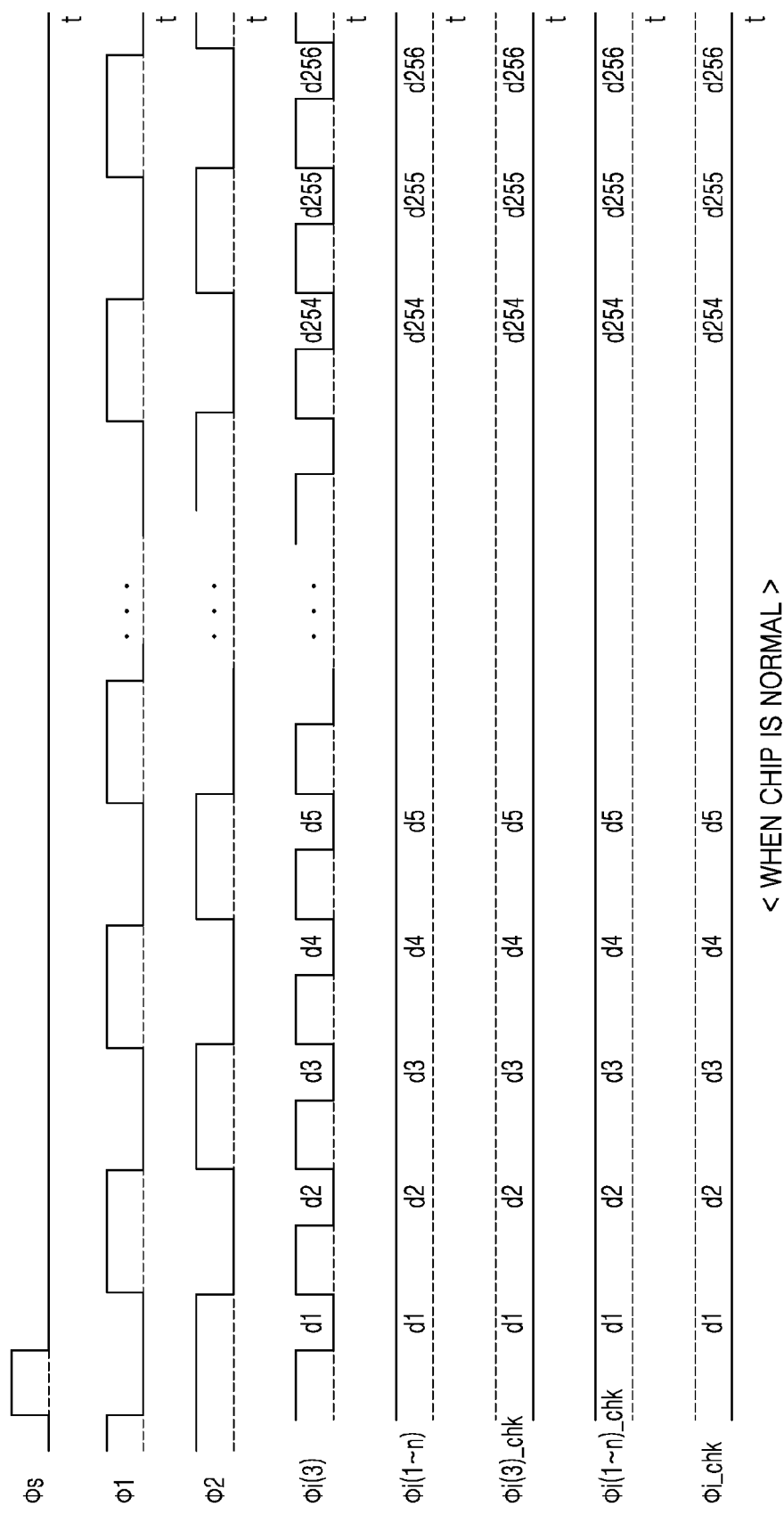

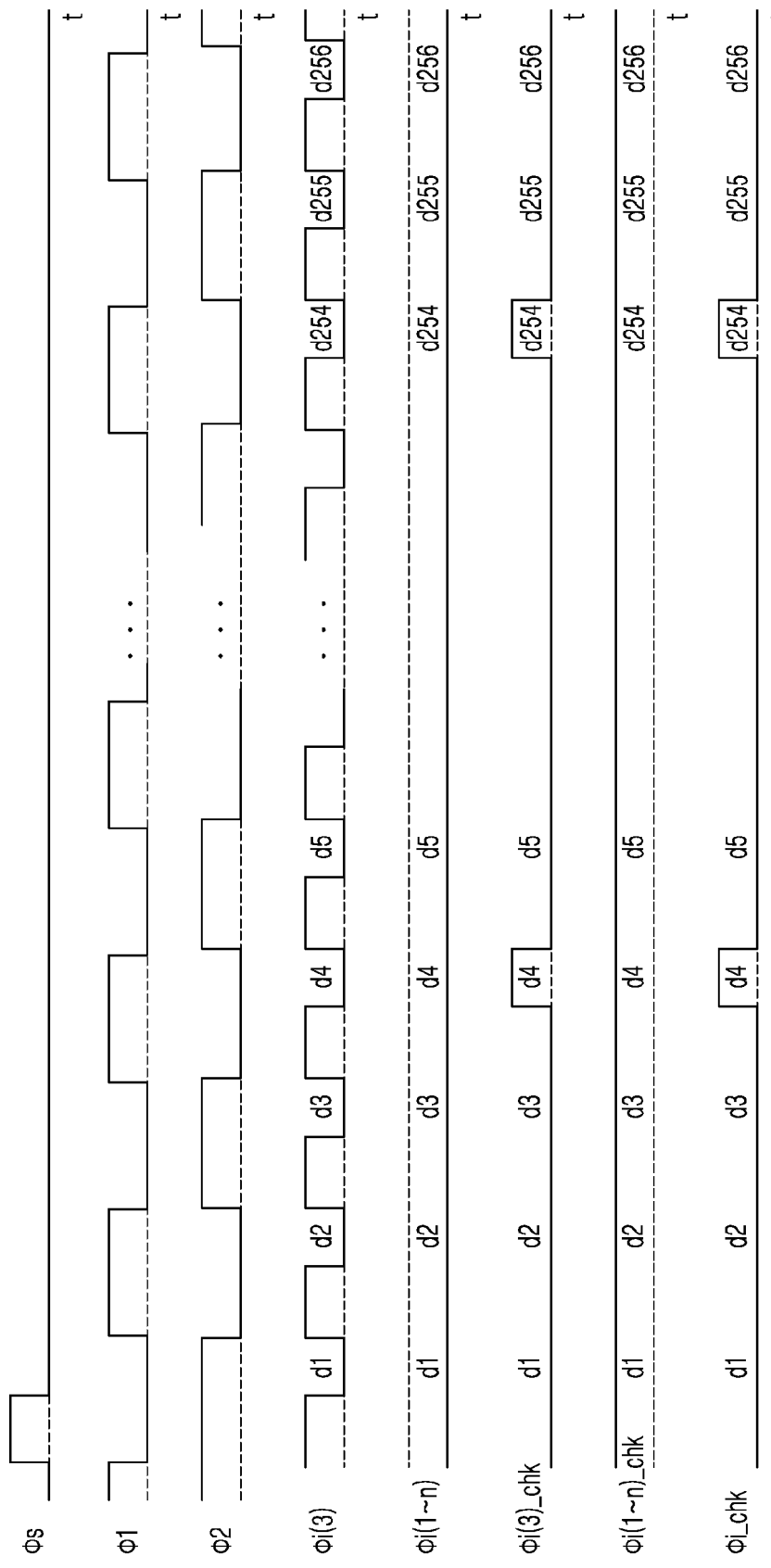

| Chip #2~n G256 | Chip #1 G256 | Φs_chk | GOOD / DEFECTIVE |
|---|---|---|---|
| L | L | H | DEFECTIVE |
| L | H | L | GOOD |

| Chip #2~n G256 | Chip #1 G256 | Φs_chk | GOOD / DEFECTIVE |
|---|---|---|---|
| L | L | L | DEFECTIVE |
| L | H | H | GOOD |

IMAGE FORMING APPARATUS FOR DETERMINING DEFECTS OF LIGHT-EMITTING ELEMENT ARRAY CHIPS

CROSS-REFERENCE TO RELATED APPLICATIONS

This application claims the benefit of Korean Patent Application No. 10-2014-0084620, filed on Jul. 7, 2014, in the Korean Intellectual Property Office, the disclosure of which is incorporated herein in its entirety by reference.

BACKGROUND

1. Field

One or more exemplary embodiments relate to an image forming apparatus determining whether any of light-emitting element array chips are defective.

2. Description of the Related Art

An image forming apparatus using light-emitting element array chips receives print data from a personal computer (PC) and forms an image by using light-emitting elements. When the light-emitting elements emit light, an electrostatic latent image is formed on a photoconductor drum in the image forming apparatus. Thereafter, a print image is output through development, transfer, and fusing processes.

A light-emitting element array chip included among the light-emitting element array chips may be defective. Light-emitting elements of a defective light-emitting element array chip may not emit light, thus causing an error. That is, an error may occur in which some printing data is not being printed on paper.

SUMMARY

One or more exemplary embodiments include an image forming apparatus determining whether any of light-emitting element array chips are defective and a method of detecting a defect in any of a plurality of light-emitting element array chips of an image forming apparatus.

According to one or more exemplary embodiments, an image forming apparatus includes a plurality of light-emitting element array chips including a light-emitting element array and a transfer element array; and a control driver applying a signal to the plurality of light-emitting element array chips. The control driver includes a check terminal that measures signals output from the plurality of light-emitting element array chips, and the control driver determines whether any of the plurality of light-emitting element array chips are defective by analyzing the signals measured at the check terminal.

According to one or more exemplary embodiments, an image forming apparatus includes a plurality light-emitting element array chips including a light-emitting element array and a transfer element array, and a control driver applying a signal to the light-emitting element array chips. Light-emitting element arrays included in the plurality of light-emitting element array chips are connected in parallel, and the control driver determines whether any of the light-emitting element arrays are defective by analyzing signals output from the light-emitting element arrays that are connected in parallel.

According to one or more exemplary embodiments, a method of detecting a defect in any of a plurality of light-emitting element array chips of an image forming apparatus includes applying a signal to the plurality of light-emitting element array chips, measuring a signal output from the light-emitting element array chips, and determining, by way of a hardware-based control driver of the image forming apparatus, whether any of the light-emitting element array chips are defective based on the measured output signal.

According to one or more exemplary embodiments, an image forming apparatus includes a plurality of light-emitting element array chips each being comprised of light-emitting elements and a control driver to determine whether any of the light-emitting elements are defective by sequentially applying a data signal in a different time slot to each of the light-emitting elements and by analyzing a signal measured at a check terminal of the control driver during each of the different time slots.

According to one or more exemplary embodiments, a method of detecting a defect in any light-emitting elements comprised by a light-emitting element array chip of an image forming apparatus includes sequentially applying a data signal during a different time slot to each of the light-emitting elements, analyzing, by way of a hardware-based control driver of the image forming apparatus, a signal measured during each of the different time slots and determining whether any of the light-emitting elements are defective based on the analyzing of the signal measured during each of the different time slots.

According to one or more exemplary embodiments, an image forming apparatus includes a plurality of light-emitting element array chips and a control driver to determine whether any of the plurality of light-emitting element array chips are defective by separately applying data signals to the plurality of light-emitting element array chips and by analyzing signals measured at a check terminal of the control driver.

Additional aspects will be set forth in part in the description which follows and, in part, will be apparent from the description, or may be learned by practice of the presented exemplary embodiments.

BRIEF DESCRIPTION OF THE DRAWINGS

These and/or other aspects will become apparent and more readily appreciated from the following description of the exemplary embodiments, taken in conjunction with the accompanying drawings in which:

FIGS. 4A and 4B are timing diagrams illustrating signals output from or measured by a control driver;

FIGS. 8A and 8B are timing diagrams illustrating operations of the image forming apparatus of FIG. 7;

FIGS. 10A and 10B are timing diagrams illustrating operations of the image forming apparatus of FIG. 9;

DETAILED DESCRIPTION

Figure 1:
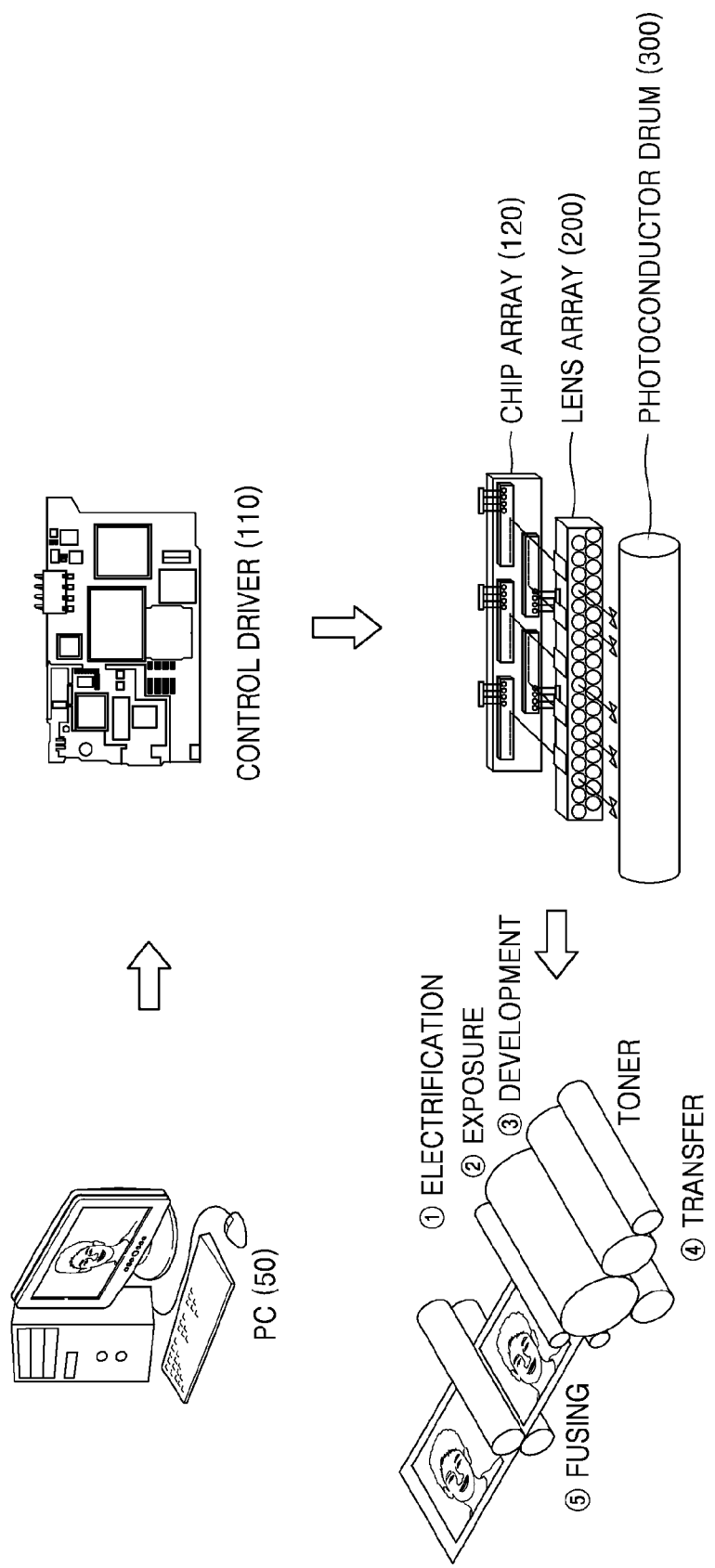
FIG. 1 is a diagram illustrating an exemplary process of outputting an image by using light-emitting element array chips.

As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope are encompassed in the inventive concept. In the description, certain detailed explanations of the related art are omitted when it is deemed that they may unnecessarily obscure the essence of the inventive concept. As used herein, the term "and/or" includes any and all combinations of one or more of the associated listed items. Expressions such as "at least one of," when preceding a list of elements, modify the entire list of elements and do not modify the individual elements of the list.

While such terms as "first," "second," etc., may be used to describe various components, such components must not be limited to the above terms. The above terms are used only to distinguish one component from another.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The exemplary embodiments of the present inventive concept will be described in detail with reference to the accompanying drawings. Like reference numerals in the drawings denote like elements, and thus their description will not be repeated.

FIG. 1 is a diagram illustrating an exemplary process of outputting an image by using light-emitting element array chips. Referring to FIG. 1, upon receiving print data from a personal computer (PC) 50, an image forming apparatus may perform operations for outputting an image.

The image forming apparatus may form an electrostatic latent image on a photoconductor drum 300 by using light-emitting elements and output an image through development, transfer, and fusing processes including electrification 1, exposure 2, development 3, transfer 4, and fusing 5.

The image forming apparatus may include, for example, a control driver 110, a chip array 120, a lens array 200, and the photoconductor drum 300.

The control driver 110 may control the chip array 120 according to the print data received from the PC 50. The chip array 120 may include a plurality of light-emitting element array chips. The control driver 110 may separately control the light-emitting element array chips.

The lens array 200 may be arranged in an axial direction (i.e., a main scanning direction) of the photoconductor drum 300. Light having passed through the lens array 200 may form an image on a surface of the photoconductor drum 300.

The photoconductor drum 300 may be exposed to light to form an electrostatic latent image. A developer (not shown) may develop the electrostatic latent image formed on the photoconductor drum 300.

Figure 2:
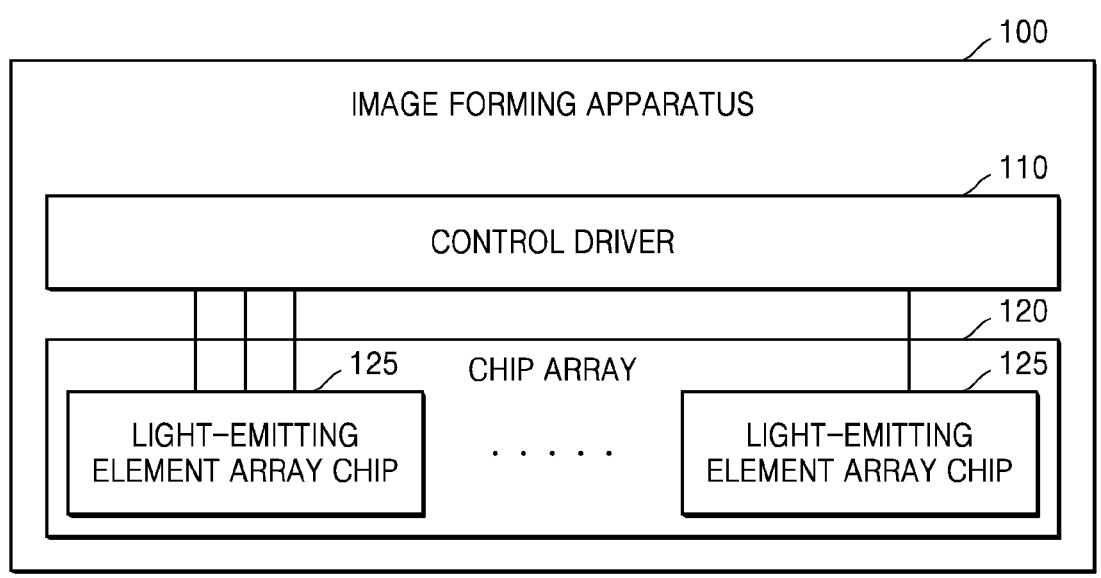
FIG. 2 is a diagram illustrating an image forming apparatus according to an exemplary embodiment.

FIG. 2 is a diagram illustrating an image forming apparatus 100 according to an exemplary embodiment. Referring to FIG. 2, the image forming apparatus 100 may include, for example, a control driver 110 and a plurality of light-emitting element array chips 125.

The control driver 110 determines whether any of the light-emitting element array chips 125 are defective. The control driver 110 determines whether any of the light-emitting element array chips 125 are defective, determines which of the light-emitting element array chips 125 are defective, and determines which light-emitting elements or which transfer elements are defective in the light-emitting element array chips 125.

The control driver 110 includes a check terminal to measure signals output from the light-emitting element array chips 125. The control driver 110 analyzes the signals measured at the check terminal, and determines whether any of the light-emitting element array chips 125 are defective based on the measures signals. A method of determining whether any of the light-emitting element array chips 125 are defective, which may be performed by the control driver 110, will be described in detail below.

The control driver 110 includes a terminal that outputs signals and a terminal that receives signals. In other words, the control driver 110 includes a terminal that outputs signals for controlling a transfer element or a light-emitting element and a terminal that receives signals from the transfer element or the light-emitting element. The control driver 110 may include at least one check terminal for determining whether any of the light-emitting element array chips 125 are defective.

The control driver 110 receives print data and operates according to the received print data. The control driver 110 receives the print data from a main board or a central processing unit (CPU) included in the image forming apparatus 100, and controls an on/off function of the light-emitting elements according to the received print data. The print data represents an image to be formed.

The control driver 110 may be software that is executed by a general purpose computer or at least one processor. Alternatively, the control driver 110 may be hardware such as a control driver.

Each of the light-emitting element array chips 125 includes a transfer element array and a light-emitting element array. The transfer element array includes include a plurality of transfer elements, and the light-emitting element array includes a plurality of light-emitting elements. The transfer elements may sequentially turn the light-emitting elements on and off. The transfer elements and the light-emitting elements may be matched one-to-one. Light emission conditions of the light-emitting elements may be determined according to states of the transfer elements. In order for a light-emitting element to emit light, a transfer element corresponding to the light-emitting element has to be in a standby state. When the transfer element is in a standby state, the on/off state of the light-emitting element may be determined according to a data signal input to the light-emitting element. That is, when the transfer element is in a standby state, it may be determined whether the light-emitting element is in an on or off state according to the data signal input to the light-emitting element. When a start signal is input to the transfer elements, the transfer elements may sequentially enter a standby signal according to a transfer signal.

The light-emitting element array chips 125 receive signals from the control driver 110 and operate according to the received signals. The light-emitting element array chips 125 may be separately controlled by the control driver 110.

The light-emitting element array chips 125 may be connected in parallel. Data lines of the light-emitting element array chips 125 may be connected in parallel, and gates of last transfer elements of the transfer element arrays may be connected in parallel.

Figure 3:
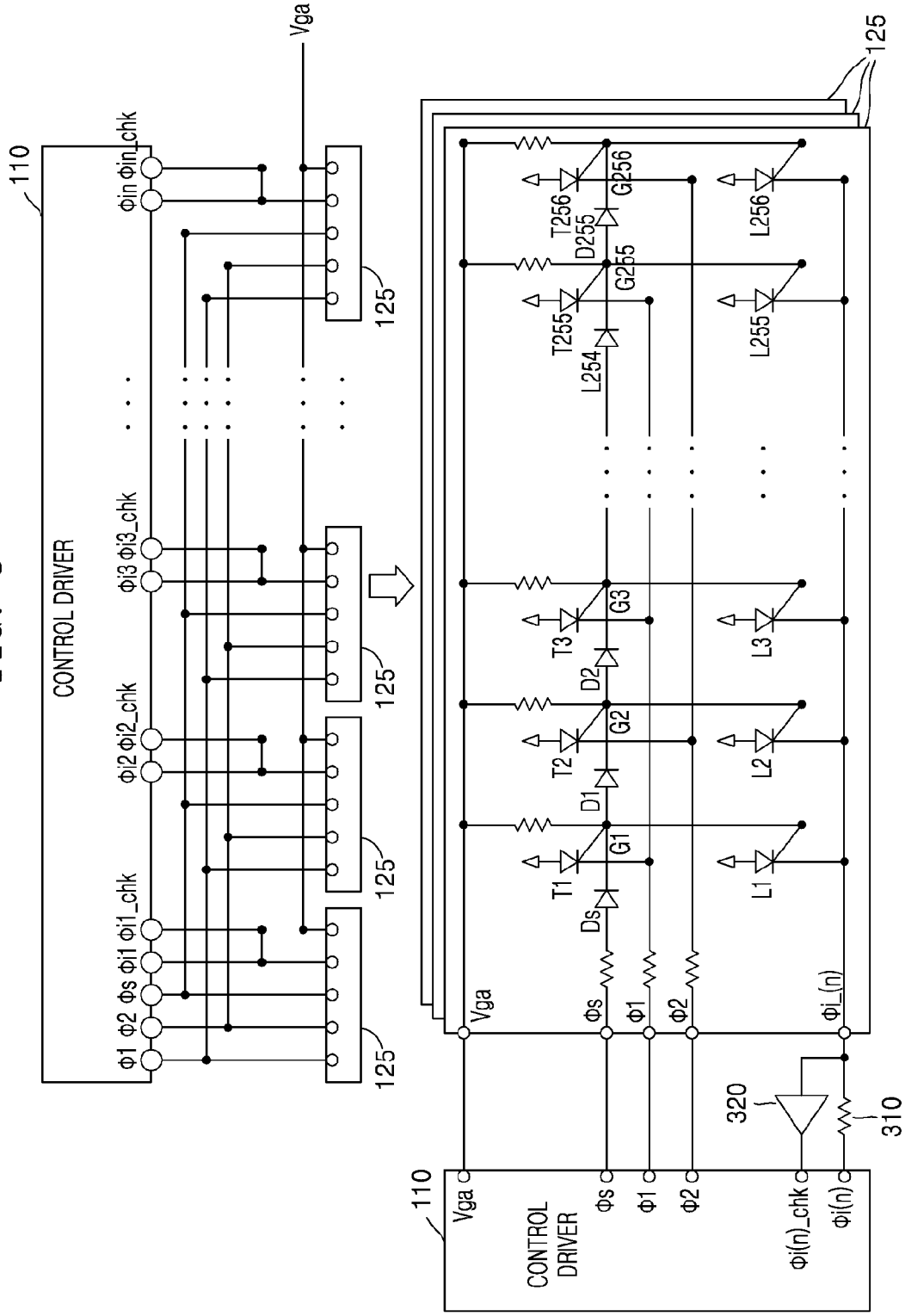
FIG. 3 is a diagram illustrating an image forming apparatus according to an exemplary embodiment.

FIG. 3 is a diagram illustrating the image forming apparatus 100 according to an exemplary embodiment. Referring to FIG. 3, the image forming apparatus 100 may determine whether any of the light-emitting element array chips 125 are defective. The image forming apparatus 100 may separately apply data signals to the light-emitting element array chips 125, and determine whether any one of the light-emitting element array chips 125 are defective by analyzing signals measured at a check terminal ($\phi i(n)\_chk$) connected to each of the light-emitting element array chips 125.

The light-emitting elements may be light-emitting thyristors, and the transfer elements may be transfer thyristors. A thyristor has a PNPN junction and includes a gate. For example, each of the light-emitting element array chips 125 may include 256 thyristors. T1 to T256 refer to the transfer thyristors and L1 to L256 refer to the light-emitting thyristors. D1 to D256 refer to diodes connected to the transfer thyristors. G1 to G256 refer to gates of the transfer thyristors. When a voltage of a predetermined level or more is applied to a gate of a thyristor, since a breakdown voltage of the thyristor is lowered, an operation voltage of the thyristor is lowered. Thus, by applying a voltage to the gate of the thyristor, the thyristors may be operated by a lower driving voltage.

The transfer thyristors enter an operating state according to a start signal and transfer signals ($\phi 1$ signal and $\phi 2$ signal). For example, when the start signal is applied to the gate G1 of the transfer thyristor T1 and a transfer signal ($\phi 1$ signal) is applied to the transfer thyristor T1, the transfer thyristor T1 enters an operating state.

When the transfer thyristor T1 is in the operating state, the light-emitting thyristor L1 enters a light-emitting state. The gate G1 of the transfer thyristor T1 is equal to a gate of the light-emitting thyristor L1. Therefore, when the transfer thyristor T1 enters the operating state, the light-emitting thyristor L1 also enters the operating state. When the light-emitting thyristor L1 is in the operating state, the light-emitting thyristor L1 emits light according to a data signal input to a terminal $\phi i$.

By repetition of the process above, the transfer thyristors T1 to T256 sequentially enter the operating state, the light-emitting thyristors L1 to L256 also enter the operating state, and the light-emitting thyristors L1 to L256 sequentially emit or do not emit light.

Terminals of the image forming apparatus 100 illustrated in FIG. 3 will be described below. $\phi 1$ refers to a terminal that outputs signals for controlling odd-numbered transfer elements, and $\phi 2$ refers to a terminal that outputs signals for controlling even-numbered transfer elements. $\phi s$ refers to a terminal that outputs signals for controlling an operation start time of the transfer elements. $\phi i(n)$ refers to a terminal that is connected to an n-th light-emitting element array chip 125 and outputs data signals. The control driver 110 includes n terminals $\phi i(n)$. $\phi i(n)\_chk$ refers to a check terminal that is connected to the n-th light-emitting element array chip among light-emitting element array chips 125 and data lines of the light-emitting elements. The control driver 110 includes n check terminals $\phi i(n)\_chk$. The $\phi i(n)\_chk$ and the $\phi i(n)$ are connected in parallel. $\phi i\_(n)$ refers to a node connected to a cathode of an n-th light-emitting element. Vga refers to ground.

The image forming apparatus 100 may include a buffer 320 and a resistor 310. The buffer 320 is connected between the control driver 110 and the light-emitting element array chips 125, and connected between the $\phi i(n)\_chk$ and the data lines of the light-emitting element array chips 125. Also, the resistor 310 may be provided between the $\phi i(n)$ and the data line of the light-emitting element array chip 125 and connected thereto. The buffer 320 may be separately connected to each of the light-emitting element array chips 125. The buffer 320 may output a voltage of a data line to the check terminal. The resistor 310 formed in a loop circuit may drop voltages when current flows. Accordingly, the voltage of the data line may change based on whether or not a loop circuit is formed, the check terminal may measure the voltage of the data line, and the control driver 110 may determine whether any of the light-emitting element array chips 125 are defective by analyzing the voltage measured at the check terminal.

Each of the light-emitting element array chips 125 is connected to the control driver 110. $\phi i(n)$ refers to a terminal that is connected to the n-th light-emitting element array chip 125, and $\phi i\_(n)$ refers to a data line of the n-th light-emitting element array chip 125.

The control driver 110 determines whether any of the light-emitting element array chips 125 are defective by analyzing a signal measured at the check terminal ($\phi i(n)$ _chk). In detail, the control driver 110 may analyze a voltage measured at ϕi(n)_chk, and thus determine whether any of the light-emitting element array chips 125 are defective. The defective light-emitting element array chip refers to a light-emitting element array chip having at least one light-emitting element that does not emit light. There may be two cases in which a light-emitting element is unable to emit light. First, the light-emitting element may be unable to emit light because the light-emitting element itself is defective. Second, the light-emitting element may be unable to emit light because a transfer element connected to the light-emitting element is defective. When the transfer element is defective, voltage is not supplied to a gate of the light-emitting element, and thus, the light-emitting element does not operate even when a data signal is applied to the light-emitting element.

The control driver 110 determines whether any of the light-emitting element array chips 125 are defective by analyzing a voltage level measured at the check terminal. For example, when all of the light-emitting element array chips 125 are normal, the voltage level measured at the check terminal is high. When at least one of the light-emitting element array chips 125 is defective, some voltage levels measured at the check terminal ϕi(n)_chk are low.

The control driver 110 may measure a voltage via the check terminal as a data signal is applied, and when a low level signal is detected, the control driver 110 may determine that at least one of the light-emitting element array chips 125 is defective. Also, the control driver 110 may determine a time point when the low level signal is detected, and thereby determine a defective light-emitting element or a defective transfer element.

Figure 4A:
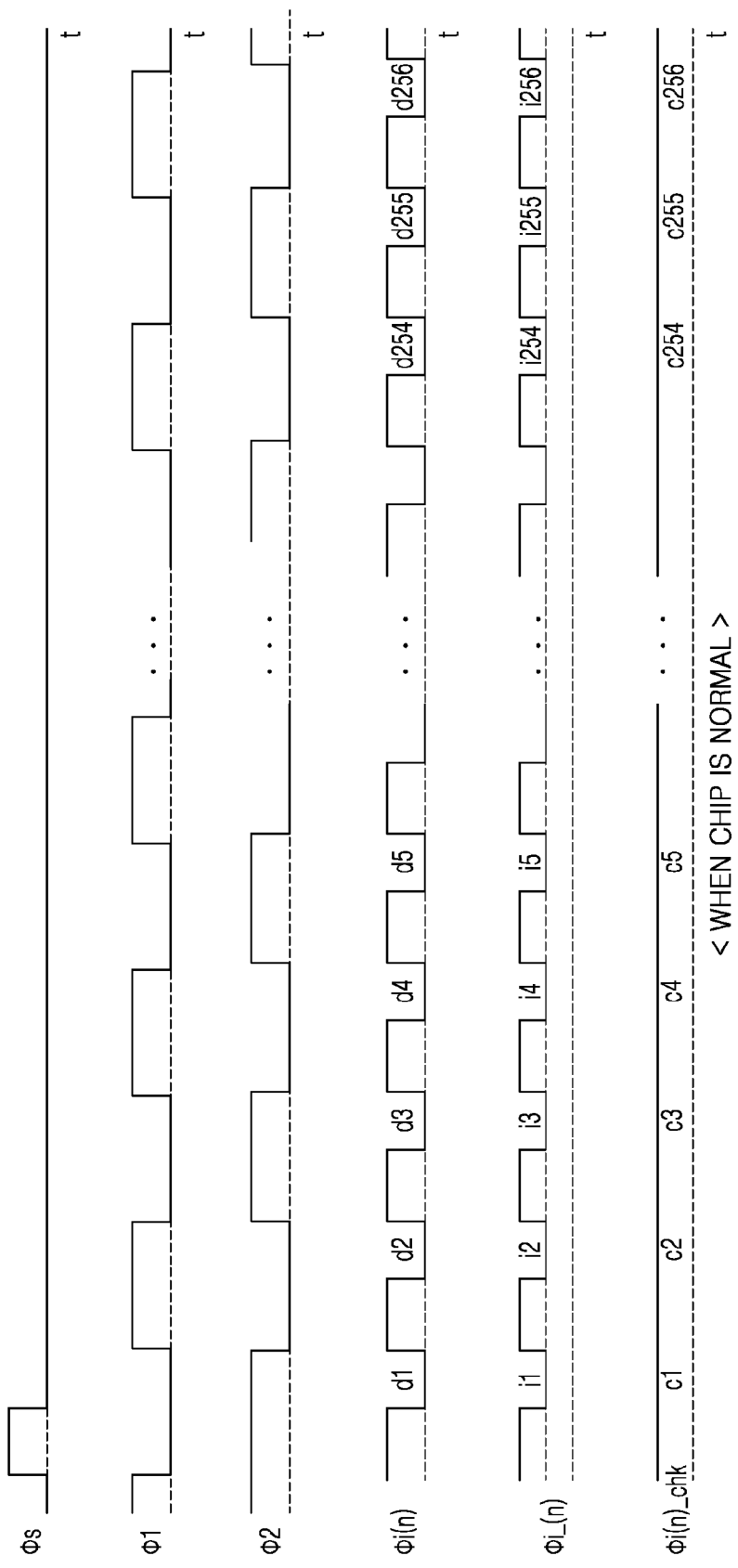

FIGS. 4A and 4B are timing diagrams illustrating signals output from or measured by the control driver 110. Referring to FIGS. 4A and 4B, the image forming apparatus 100 may determine whether any of the light-emitting element array chips 125 are defective according to a voltage measured at the check terminal. FIG. 4A is a timing diagram of an example in which all of the light-emitting element array chips 125 are normal, and FIG. 4B is a timing diagram of an example in which some of the light-emitting element array chips 125 are defective.

The control driver 110 may output a transfer signal via the ϕ1 and ϕ2. The control driver 110 may output a start signal via the ϕs. The control driver 110 may output a data signal via the ϕi(n).

The start signal that is output via the terminal ϕs is applied once to start operations of the light-emitting element array chips 125.

The transfer signal may have two alternate potentials. When a first voltage is a high level voltage, a second voltage is a low level voltage. A first transfer signal that is output via the ϕ1 is a signal applied to the odd-numbered transfer elements, and a second transfer signal that is output via the ϕ2 is a signal applied to the even-numbered transfer elements. The first and second transfer signals have two alternate potentials (i.e., a high level and a low level), and alternate between having a high level and a low level. The first and second transfer signals overlap for a predetermined time. The first and second transfer signals overlap for a predetermined time so that a transfer element may enter a standby state before operations of a previous transfer element finish.

In order to determine any defect of the light-emitting element array chips 125, the control driver 110 outputs a signal causing all of the light-emitting elements to emit light. In detail, the control driver 110 may output the data signal via the ϕi(n) so that all light-emitting elements emit light.

In FIG. 4A, the control driver 110 detects that check signals related to the light-emitting elements are high. In other words, check signals measured at the ϕi(n)_chk are high. Therefore, the control driver 110 may determine that the light-emitting element array chips 125 are normal.

In FIG. 4B, the control driver 110 may detect that check signals of some of the light-emitting elements are low. In other words, the control driver 110 may detect that voltage measured at the ϕi(n)_chk is low. FIG. 4B illustrates an example in which a fourth light-emitting element or a fourth transfer element is defective. Since a signal measured at the ϕi(n)_chk at a time point when the fourth light-emitting element would have emitted light is low, the control driver 110 may determine that the fourth light-emitting element or the fourth transfer element is defective.

The operations of the light-emitting element array chips 125 will be described with reference to a first light-emitting element L1. When a voltage of a data signal output from the ϕi(n) is high (3.3V) and a voltage applied to an anode of the first light-emitting element L1 is 3.3V, equal voltages are applied to both sides of the first light-emitting element L1, and thus current does not flow. In other words, a loop circuit from the ϕi(n) to the anode of the first-lighting element L1 is not formed. Therefore, a voltage of the data line (ϕi_(n)) is equal to the signal (3.3V) applied from the ϕi(n), and a voltage (3.3V) equal to that of the data line (ϕi_(n)) is applied to the check terminal (ϕi(n)_chk). When the control driver 110 detects that the voltage applied to the check terminal (ϕi(n)_chk) is 3.3V, the control driver 110 may determine the voltage as a high level voltage.

When a voltage of a data signal output from the ϕi(n) is low (0V) and a voltage applied to the anode of the first light-emitting element L1 is 3.3V, current flows through the first light-emitting element L1. In other words, a loop circuit is formed from the ϕi(n) to the anode of the first light-emitting element L1. Therefore a voltage of the data line (ϕi_(n)) is about 1.8V, which is about 1.5V less than the voltage (3.3V) applied from the ϕi(n) to the anode of the first light-emitting element L1. Therefore, a voltage (about 1.8V) equal to that of the data line is applied to the check terminal (ϕi(n)_chk). When the control driver 110 detects that the voltage applied to the check terminal (ϕi(n)_chk) is 1.8V, the control driver 110 may determine the voltage as a high level voltage, and may thereby determine that a light-emitting element or a transfer element is normal.

When a light-emitting element (L1) or a transfer element (T1) is defective, a voltage of a data signal output from the ϕi(n) is low (0V), and a voltage applied to the anode of the first light-emitting element L1 is 3.3V, and current does not flow through the first light-emitting element L1, e.g., due to L1 being defective. In other words, a loop circuit is not formed from the ϕi(n) to the anode of the first light-emitting element L1. Therefore, the voltage of the data line (ϕi_(n)) is equal to the voltage (0V) of a signal applied from the ϕi(n), and a voltage (0V) equal to that of the ϕi(n) is applied to the check terminal (ϕi(n)_chk). When the control driver 110 detects that the voltage applied to the check terminal (ϕi(n)_chk) is 0V, the control driver 110 may determine the voltage as a low level voltage, and determine that the light-emitting element or the transfer element is defective.

According to the method above, the image forming apparatus 100 may not only determine whether any of the light-emitting element array chips 125 are defective, but may also determine or locate a defective light-emitting element or a defective transfer element.

Figure 5:
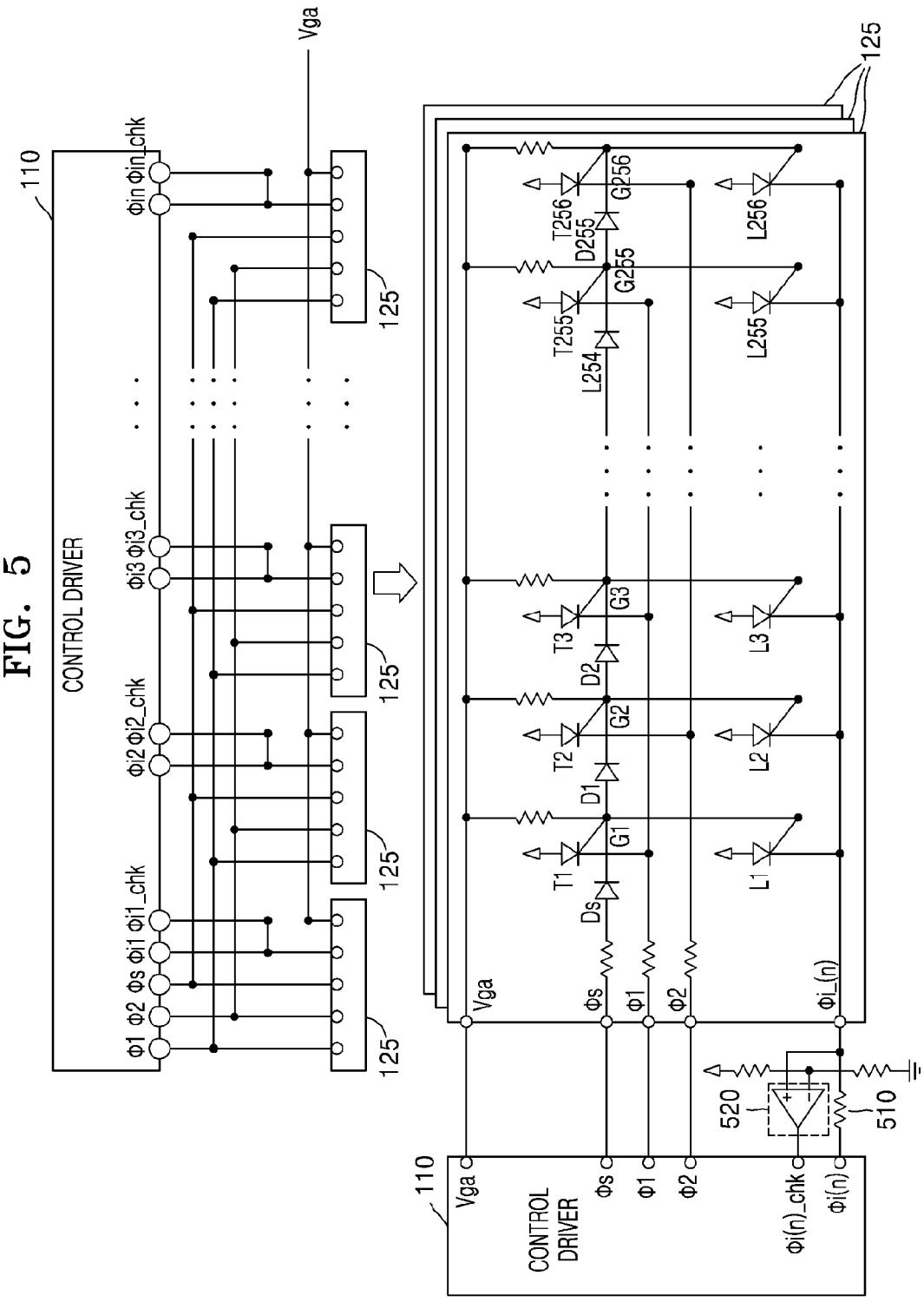
FIG. 5 is a diagram illustrating an image forming apparatus according to an exemplary embodiment.

FIG. 5 is a diagram illustrating the image forming apparatus 100 according to an exemplary embodiment. Referring to FIG. 5, the image forming apparatus 100 includes a comparing unit 520 instead of the buffer 320. Operations of the image forming apparatus 100 of FIG. 5 are the same as those of FIG. 3 except for operations of the comparing unit 520. A resistor 510 may be provided between the ϕi(n) and the data line of the light-emitting element array chips 125 and connected thereto.

The comparing unit 520 may output a comparison result obtained by comparing a voltage of a data line and a threshold value to a check terminal of the control driver 110. The threshold value may be determined with regard to a voltage applied to a cathode of a light-emitting element and voltage drop of the light-emitting element. For example, when a voltage of 3.3V is applied to the cathode of the light-emitting element and the voltage drop of the light-emitting element is 1.5V, the threshold value may be determined as 1.8V or less.

The comparing unit 520 may output the comparison result as a 1 or 0. For example, if the voltage of the data line is greater than the threshold value, the comparing unit 520 may output a 1 to the control driver 110, and if not, may output a 0 to the control driver 110.

Figure 6:
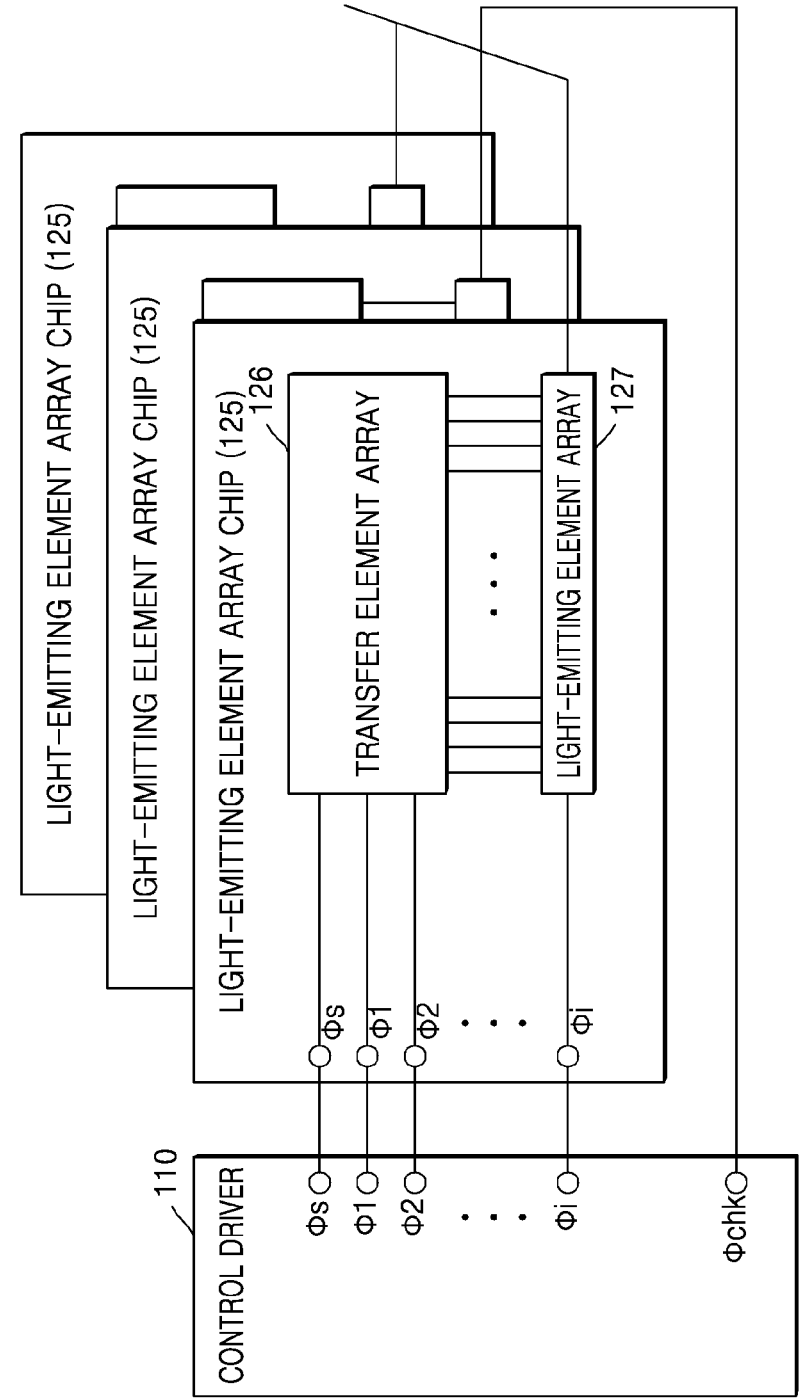
FIG. 6 is a diagram illustrating a structure of an image forming apparatus according to an exemplary embodiment.

FIG. 6 is a diagram illustrating a structure of the image forming apparatus 100 according to an exemplary embodiment. Referring to FIG. 6, light-emitting element arrays 127 may be connected in parallel and connected to the check terminal (ϕchk). The image forming apparatus 100 may determine whether any of the light-emitting element array chips 125 are defective by analyzing a voltage output via the check terminal. In detail, the image forming apparatus 100 may separately determine whether any of the light-emitting element array chips 125 are defective by applying a signal such that only a light-emitting element array chip to be checked operates among the light-emitting element array chips 125.

Figure 7:
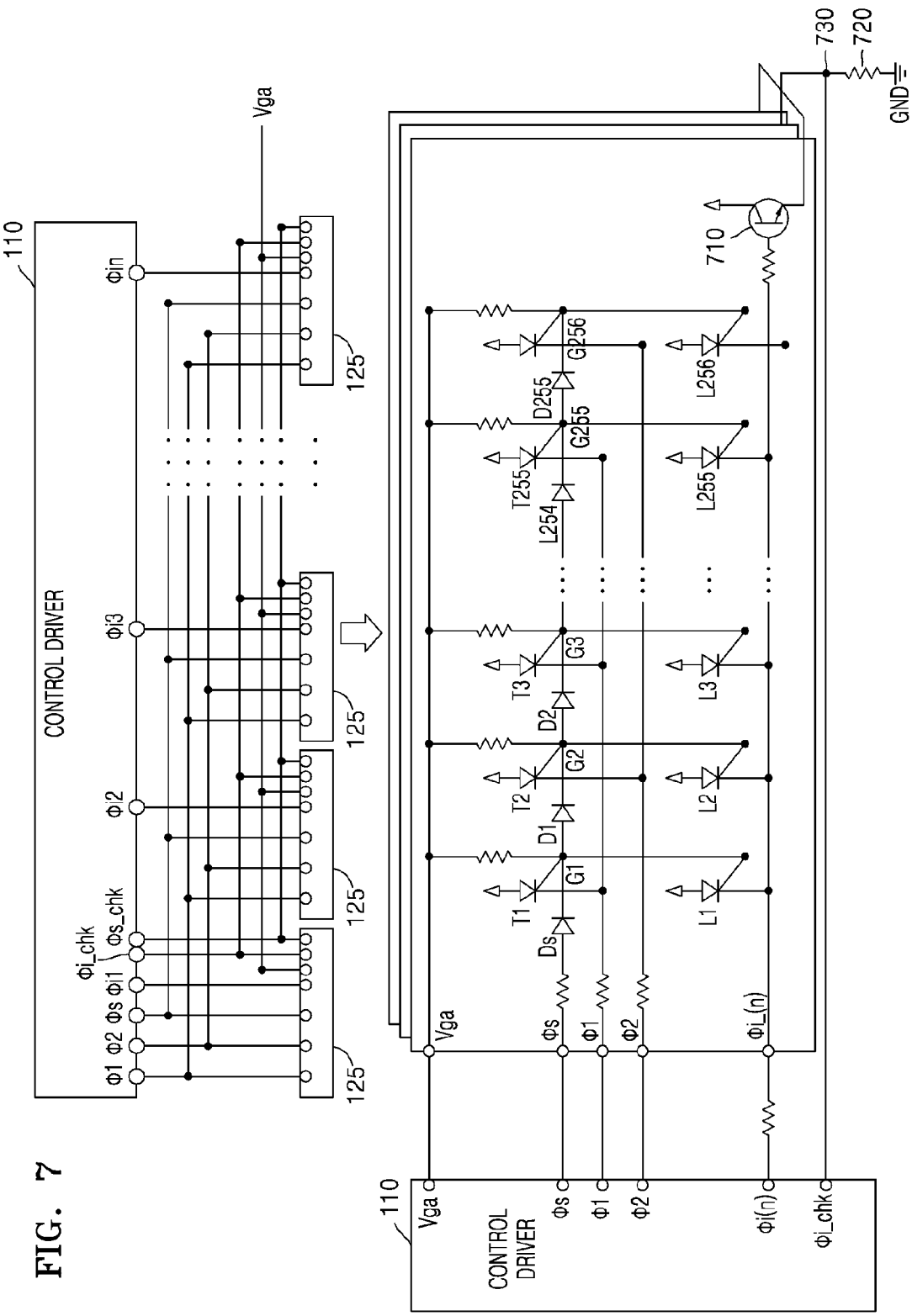
FIG. 7 is a diagram illustrating an image forming apparatus according to an exemplary embodiment.

FIG. 7 is a diagram illustrating the image forming apparatus 100 according to an exemplary embodiment. Referring to FIG. 7, in the image forming apparatus 100, each of the light-emitting element array chips 125 includes a transistor 710. The image forming apparatus 100 includes a pull-down resistor 720 connected to cathodes of light-emitting elements. A base of the transistor 710 may be connected to the cathodes of the light-emitting elements, and emitters of the transistors 710 are connected to the check terminal (ϕi_chk) in parallel. The pull-down resistor 720 may be connected to a node 730. The pull-down resistor 720 may function in the same way as the OR gate. Therefore, when a high level signal is output from the light-emitting element array chip to be checked among the light-emitting element array chips 125 and low level signals are output from the remaining ones of the light-emitting element array chips 125, the signal measured at the check terminal is high.

A single check terminal (ϕi_chk) is included in the control driver 110. The control driver 110 may analyze a voltage measured at the check terminal to determine whether any of the light-emitting element array chips 125 are defective and determine which transfer element or which light-emitting element is defective.

The control driver 110 may apply a signal such that only the light-emitting element array chip to be checked among the light-emitting element array chips 125 operates. The control driver 110 may apply signals only to the light-emitting element array chip to be checked from among the light-emitting element array chips 125. Therefore, the control driver 110 may monitor a voltage of a data line of the light-emitting element array chip 125 to be checked via the check terminal ϕi_chk.

The transistor 710 may only operate when the light-emitting elements are normal. Since the base of the transistor 710 is connected to the data line, the transistor 710 may operate only when a voltage of the data line is high. The voltage of the data line maintains a high level when all of the light-emitting elements are normal, but maintains a low level when any of the light-emitting elements are defective. For example, when a light-emitting element is defective, a data signal is low, and thus a loop circuit is not formed. As a result, a voltage of a data line also maintains a low level. Therefore, the control driver 110 may determine that a light-emitting element array chip is defective when the voltage of a data line corresponding thereto is low, and determine that a light-emitting element is defective based on a time point when the voltage of the data line is measured as low.

Figure 8A:
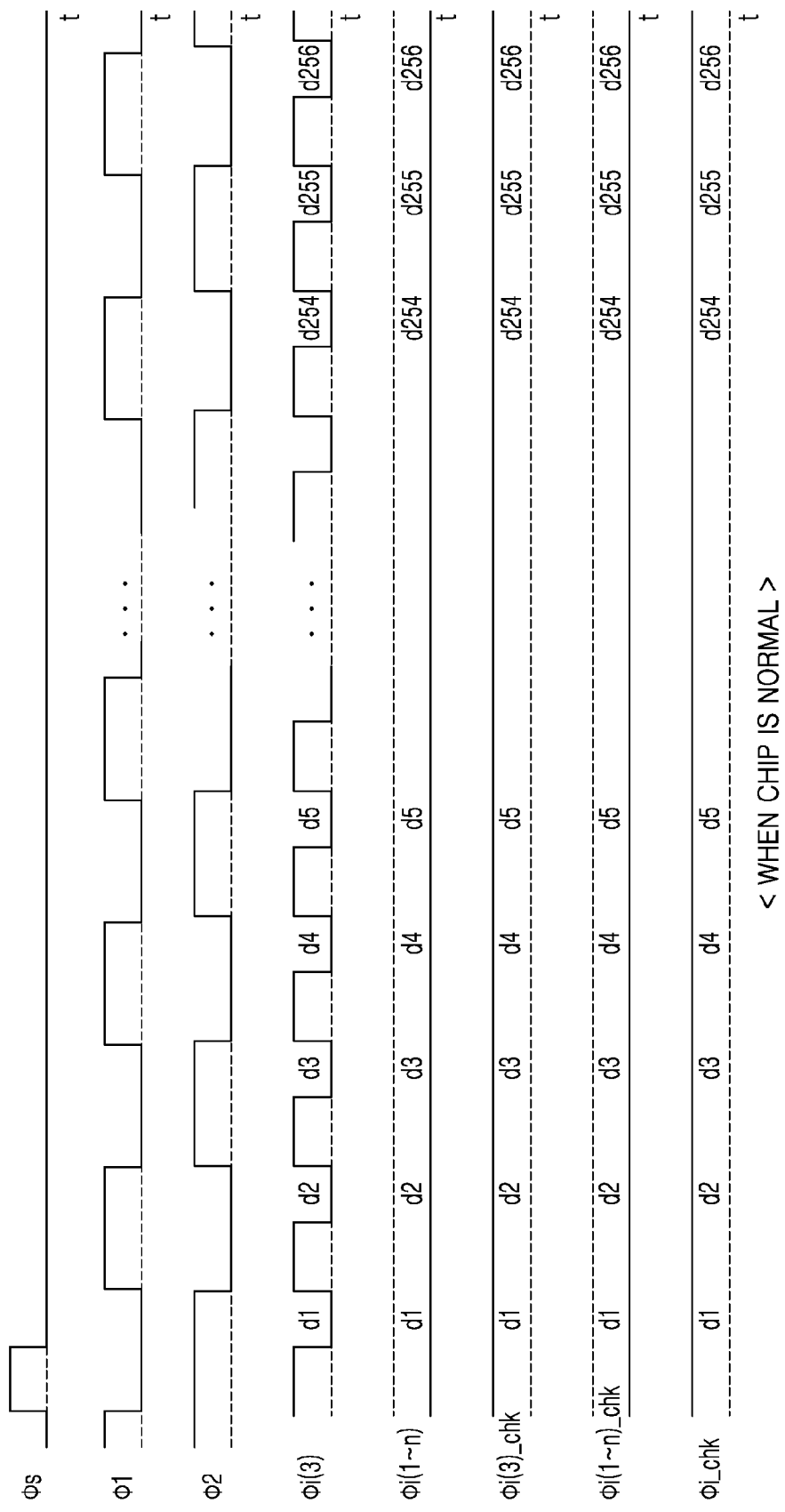

FIGS. 8A and 8B are timing diagrams illustrating operations of the image forming apparatus 100 of FIG. 7. FIG. 8A is a timing diagram of an example in which a third light-emitting element array chip among the light-emitting element array chips 125 is normal, and FIG. 8B is a timing diagram of an example in which fourth and $254^{th}$ light-emitting elements included in the third light-emitting element array chip among the light-emitting element array chips 125 are defective.

Referring to FIG. 8A, the control driver 110 checks operations of the third light-emitting element array chip among the light-emitting element array chips 125. The control driver 110 may apply a signal such that only the third light-emitting element array chip operates. The control driver 110 applies a low level data signal to the light-emitting element array chips 125 except for the third light-emitting element array chip. Therefore, light-emitting elements of the light-emitting element array chips 125 except for the third light-emitting element array chip do not operate. The control driver 110 outputs a start signal via the ϕs and output transfer signals via the ϕ1 and the ϕ2. Since the third light-emitting element array chip will be checked, the control driver 110 applies a data signal via a ϕi(3) such that light-emitting elements included in the third light-emitting element array chip all emit light. The control driver 110 applies a low level data signal to ϕi(1) to ϕi(n) except for the ϕi(3). Therefore, a high level voltage is measured at a ϕi(3)_chk, and a low level voltage is measured at (ϕi(1)_chk to ϕi(n)_chk except for the ϕi(3)_chk. The transistors 710 connected in parallel and the pull-down resistor 720 function in the same way as the OR gate. When signals of the (ϕi(1)_chk to ϕi(n)_chk are applied to each of the transistors 710, a high level voltage is measured at the ϕi_chk because of the high level voltage of the ϕi(3)_chk.

Referring to FIG. 8B, the control driver 110 may apply the same signal as in FIG. 8A. However, since FIG. 8B illustrates an example including a defective light-emitting element, a level of a signal measured at the check terminal is different from that of FIG. 8A. At a time point when the fourth and $254^{th}$ light-emitting elements of the third light-emitting element array chip emit light, a low level voltage is measured at the ϕi(3)_chk and low level voltages are measured at the (ϕi(1)_chk to ϕi(n)_chk except for the ϕi(3)_chk. Therefore, since the voltages of the (ϕi(1)_chk to ϕi(n)_chk are all low, a low level voltage may also be measured at the ϕi_chk. The control driver 110 may determine that a light-emitting element at a time point when a low level voltage is measured at the ϕi_chk is defective.

Figure 9:
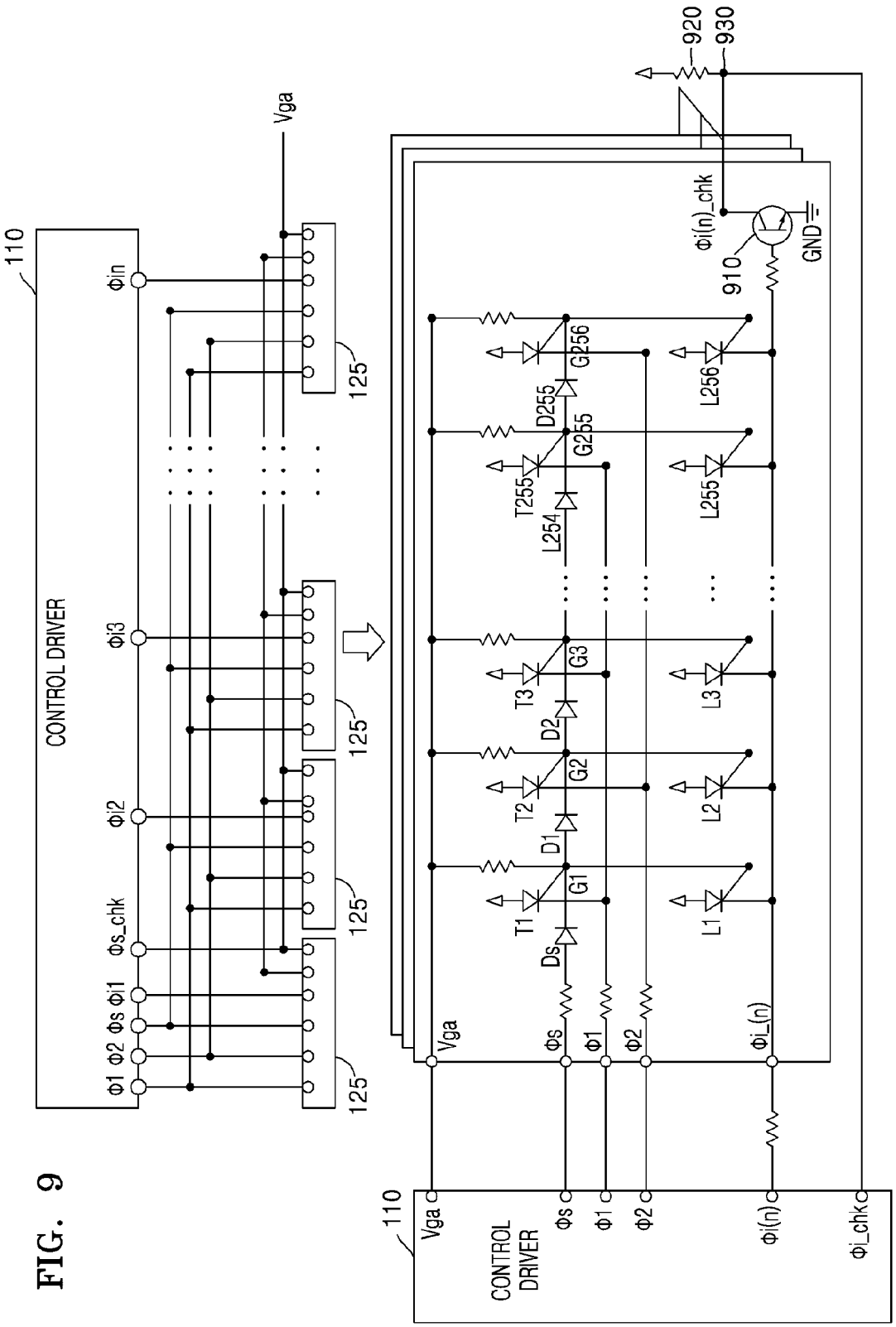
FIG. 9 is a diagram illustrating an image forming apparatus according to an exemplary embodiment.

FIG. 9 is a diagram illustrating the image forming apparatus 100 according to an exemplary embodiment. Referring to FIG. 9, in the image forming apparatus 100, each of the light-emitting element array chips 125 includes a transistor 910. The image forming apparatus 100 includes a pull-up resistor 920 connected to the cathodes of the light-emitting elements. A base of the transistor 910 is connected to the cathodes of the light-emitting elements, and collectors of the transistors 910 are connected in parallel. ϕi(n)_chk indicates a collector of the transistor 910 of an n-th light-emitting element array chip among the light-emitting element array chips 125. The collectors of the transistors 910 are connected to the check terminal (ϕi_chk) and the pull-up resistor 920 is connected to a node 930. The transistors 910 and the pull-up resistor 920 function in the same way as the AND gate.

The control driver 110 may apply a data signal to only the light-emitting element array chip 125 to be checked, and apply a low level signal to the light-emitting element array chips 125 except for the light-emitting element array chip 125 to be checked. Therefore, the transistors 910 of the light-emitting element array chips 125 except for the light-emitting element array chip 1250 to be checked do not operate, and the transistor 910 of the light-emitting element array chip 125 to be checked operates according to whether a light-emitting element and a transfer element is normal. When the light-emitting elements included in the light-emitting element array chips 125 are all normal, the transistor 910 operates and current flows from the Vcc to the transistor 910. Therefore, a low level voltage is measured at the check terminal (ϕi_chk). Alternatively, when at least one light-emitting element included in the light-emitting element array chip 125 to be checked is defective, the transistor 910 does not operate, and current does not flow from the Vcc to the transistor 910. Therefore, a high level voltage is measured at the check terminal ϕi_chk.

FIGS. 10A and 10B are timing diagrams illustrating operations of the image forming apparatus 100 of FIG. 9. FIG. 10A is a timing diagram of an example in which the third light-emitting element array chip among the light-emitting element array chips 125 is normal, and FIG. 10B is a timing diagram of an example in which the fourth and $254^{th}$ light-emitting elements included in the third light-emitting element array chip among the light-emitting element array chips 125 are defective.

Referring to FIG. 10A, the control driver 110 checks operations of the third light-emitting element array chip. The control driver 110 applies a signal such that only the third light-emitting element array chip operates. The control driver 110 applies a high level data signal to the light-emitting element array chips 125 except for the third light-emitting element array chip. In detail, the control driver 110 applies the high level data signal to the ϕi(1) to ϕi(n) except for the ϕi(3). Therefore, the light-emitting elements and the transistors 910 of the light-emitting element array chips 125 except for the third light-emitting element array chip do not operate, and a high level voltage is measured at the (ϕi(1)_chk to ϕi(n)_chk except for the ϕi(3)_chk.

Since the third light-emitting element array chip will be checked, the control driver 110 applies a data signal via the ϕi(3) such that the light-emitting elements included in the third light-emitting element array chip all emit light. Since the transistor 910 connected to the third light-emitting element array chip operates when the third light-emitting element array chip is normal, a low level voltage is measured at the ϕi(3)_chk. However, voltages at the (ϕi(1)_chk to ϕi(n)_chk except for the voltage at the ϕi(3)_chk have a high level. Therefore, the pull-up resistor 920 and the transistor 910, which are connected in parallel, function in the same way as an AND gate, and thus, a low level voltage is measured at the ϕi_chk.

Referring to FIG. 10B, the control driver 110 may apply the same signal as in FIG. 10A. However, since FIG. 10B illustrates an example including a defective light-emitting element, a level of a signal measured at the check terminal is different from that of FIG. 10A. At a time point when the fourth and $254^{th}$ light-emitting elements of the third light-emitting element array chip emit light, a high level voltage is measured at the ϕi(3)_chk and high level voltages are measured at the (ϕi(1)_chk to (ϕi(n)_chk except for the ϕi(3)_chk. Therefore, since the voltages of the (ϕi(1)_chk to ϕi(n)_chk all have a high level, a high level voltage is also measured at the ϕi_chk. The control driver 110 may determine that a light-emitting element at a time point when a high level voltage is measured at the ϕi_chk is defective.

Figure 11:
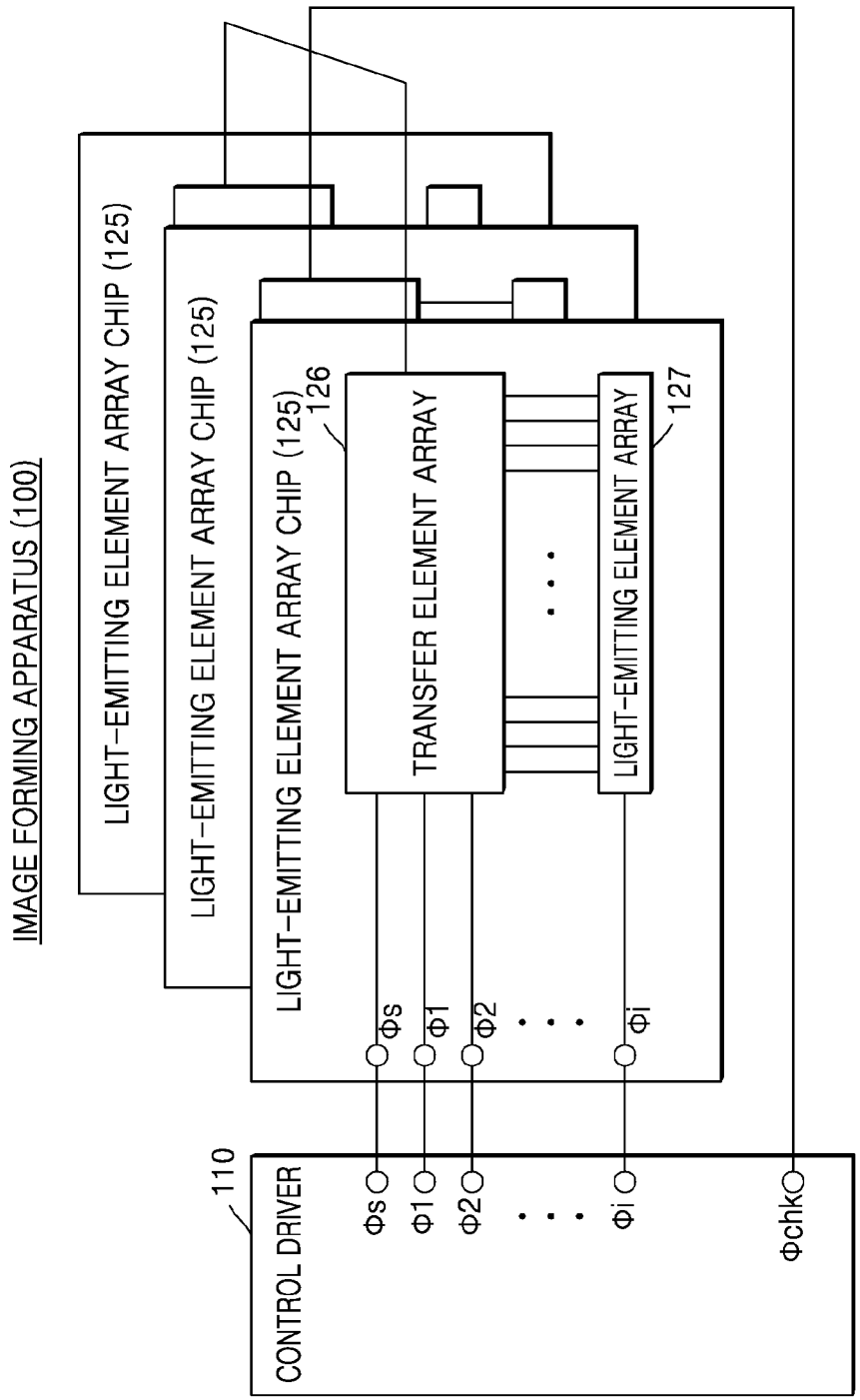
FIG. 11 is a diagram illustrating a structure of an image forming apparatus according to another exemplary embodiment.

FIG. 11 is a diagram illustrating a structure of the image forming apparatus 100 according to another exemplary embodiment. Referring to FIG. 11, the image forming apparatus 100 may determine whether any of a plurality of transfer element arrays 126 are defective. In the image forming apparatus 100 according to the embodiment illustrated in FIG. 11, the plurality of transfer element arrays 126 are connected to a check terminal (ϕchk) in parallel. The transfer element arrays 126 that are connected in parallel may be connected to a pull-up resistor, a diode and a pull-up resistor, or a transistor and a pull-up resistor. Embodiments will be described in detail with reference to FIGS. 12 to 20.

Figure 12:
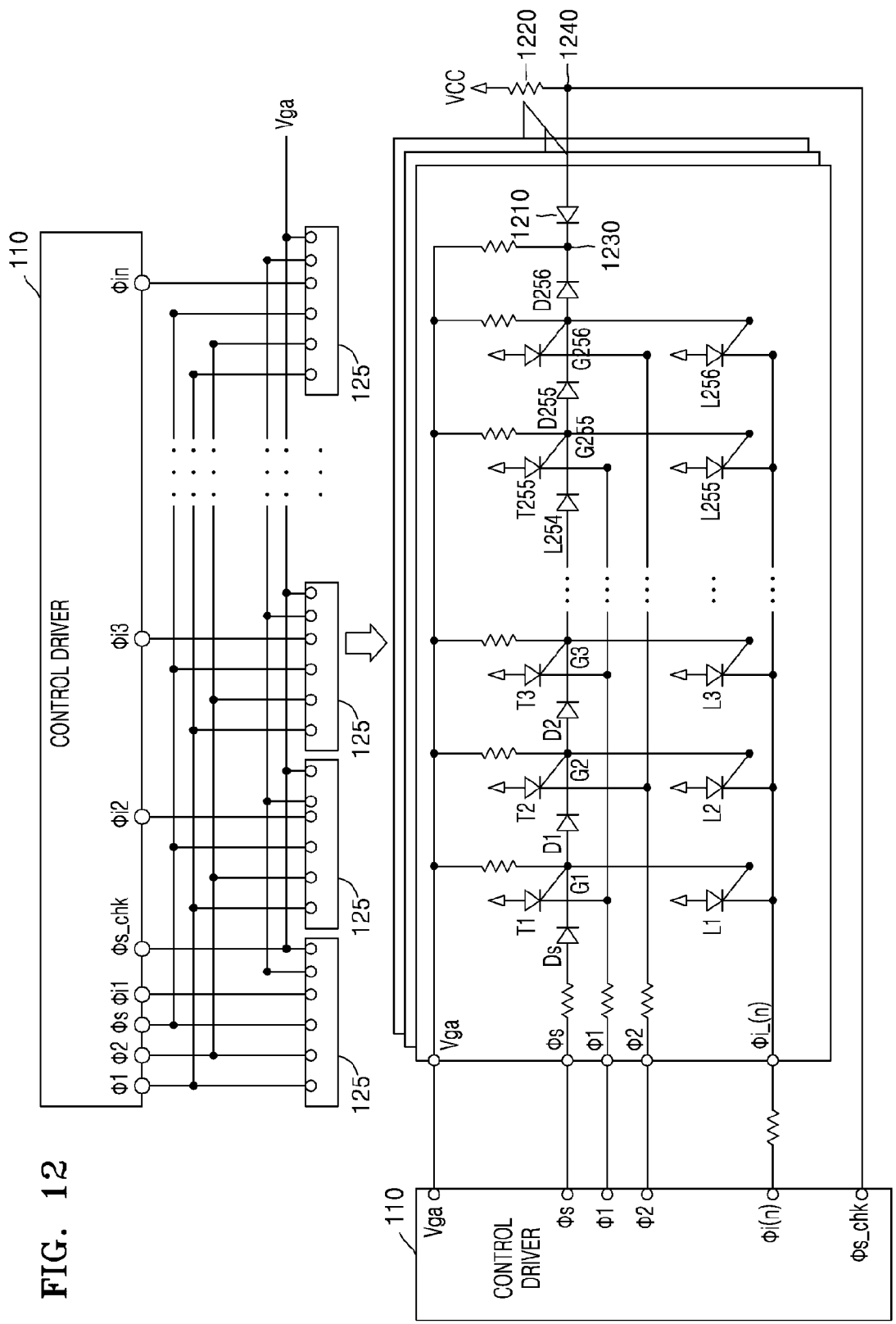
FIG. 12 is a diagram illustrating an image forming apparatus according to an exemplary embodiment.

FIG. 12 is a diagram illustrating the image forming apparatus 100 according to an exemplary embodiment. Referring to FIG. 12, in the image forming apparatus 100, each of the light-emitting element array chips 125 includes a diode 1210. The image forming apparatus 100 includes a pull-up resistor 1220 which are connected to a last diode D256 of one of the transfer element arrays 126. A cathode of the diode 1210 may be connected to a cathode of the last diode D256, and an anode of the diode 1210 may be connected to the pull-up resistor 1220. A node 1240 may be connected to a check terminal (ϕs_chk), the anode of the diode 1210, and the pull-up resistor 1220.

The image forming apparatus 100 may determine whether any of the light-emitting element array chips 125 are defective by analyzing a voltage measured at a single check terminal (ϕs_chk). In detail, the image forming apparatus 100 may determine that one of the light-emitting element array chips 125 is defective. That is, the image forming apparatus 100 may determine that one of the light-emitting element array chips 125 includes a defective transfer element. A low level signal is output from the node 1240 at a predetermined time point in an n-th light-emitting element array chip from among the light-emitting element array chips 125) that includes at least one defective transfer element. When the image forming apparatus 100 detects a low level signal, the image forming apparatus 100 may determine that one of the light-emitting element array chips 125 is defective and includes a defective transfer element.

A ϕs(n)_chk 1230 represents the cathode of the last diode D256 of the n-th light-emitting element array chip 125. The transfer element arrays 126 are connected in parallel at the node 1240. The pull-up resistor 1220 connected to the node 1240 functions similarly to the AND gate. In other words, only when all signals input from (ϕs(1)_chk to ϕs(n)_chk connected to the node 1240 are high level voltages, a high level voltage is measured at the check terminal. When a low level voltage is output from at least one node selected from the ($\phi$s(1)_chk to the $\phi$s(n)_chk, a low level voltage is measured at the check terminal.

When a low level voltage is measured at the check terminal, the control may determine that at least one light-emitting element array chip is defective from among n light-emitting element array chips 125. A method of determining whether any of the individual light-emitting element array chips 125 are defective will be described in detail with reference to FIG. 14.

Figure 13:
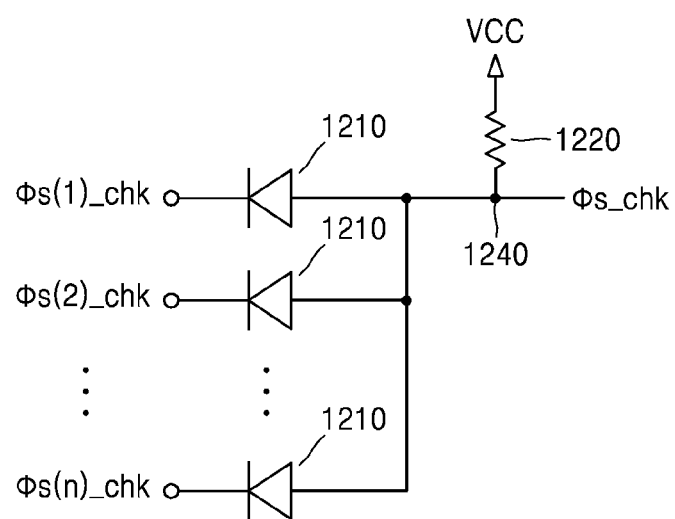
FIG. 13 is a circuit diagram illustrating a portion of the image forming apparatus of FIG. 12.

FIG. 13 is a circuit diagram illustrating a portion of the image forming apparatus 100 of FIG. 12. Referring to FIG. 13, the $\phi$s(1)_chk represents a cathode of a last diode D256 of a first light-emitting element array chip among the light-emitting element array chips 125, a ($\phi$s(2)_chk represents a cathode of a last diode D256 of a second light-emitting element array chip 125, and the $\phi$s(n)_chk represents a cathode of a last diode D256 of the n-th light-emitting element array chip from among the light-emitting array chips 125. The ($\phi$s(1)_chk to the $\phi$s(n)_chk are connected to respective diodes 1210, which are inverse diodes, of the light-emitting element array chips 125.

The pull-up resistor 1220 may function in the same way as the AND gate. When a Vcc is a high level voltage and levels of voltages of the ($\phi$s(1)_chk to the $\phi$s(n)_chk are all high, voltages having the same magnitude are applied to both sides of the diode 1210, and thus current does not flow. Therefore, a high level voltage is measured at the $\phi$s_chk. However, when a voltage level of at least one node selected from the ($\phi$s(1)_chk to $\phi$s(n)_chk is low, current flows to a low level node. Therefore, a low level voltage is measured at the $\phi$s_chk.

Figure 14:
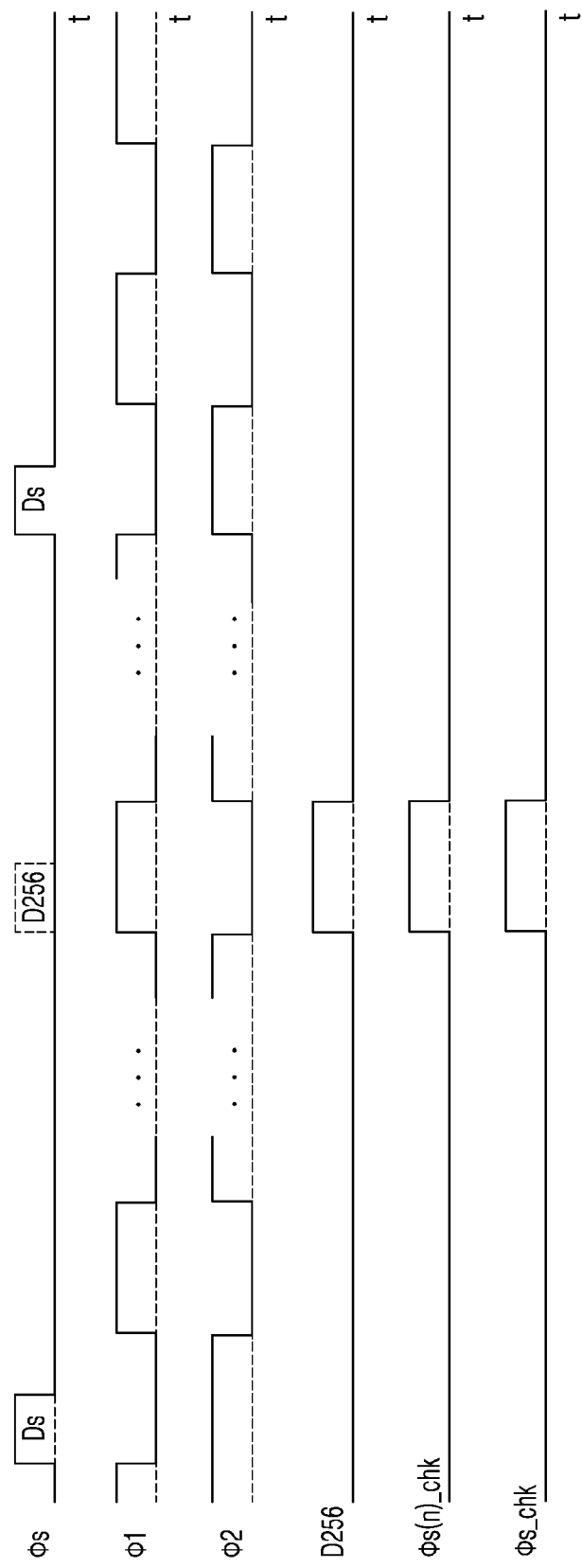
FIG. 14 is a timing diagram illustrating operations of the image forming apparatus of FIG. 12.

FIG. 14 is a timing diagram illustrating operations of the image forming apparatus 100 of FIG. 12. FIG. 14 is a timing diagram of an example in which the light-emitting element array chips 125 are all normal. The control driver 110 may output a start signal to the transfer element arrays 126. The start signal is sequentially shifted from a diode Ds to diodes D1 to D256. The control driver 110 may output a transfer signal via $\phi$1 and $\phi$2 according to a timing of the start signal.

Since all of the light-emitting element array chips 125 are normal, voltages of each $\phi$s(n)_chk is high at a time point when a start signal is applied to a 256$^{th}$ diode D256. Therefore, a high level voltage is also measured at the $\phi$s_chk, and the control driver 110 determines that all of the light-emitting element array chips 125 are normal.

Figure 15:
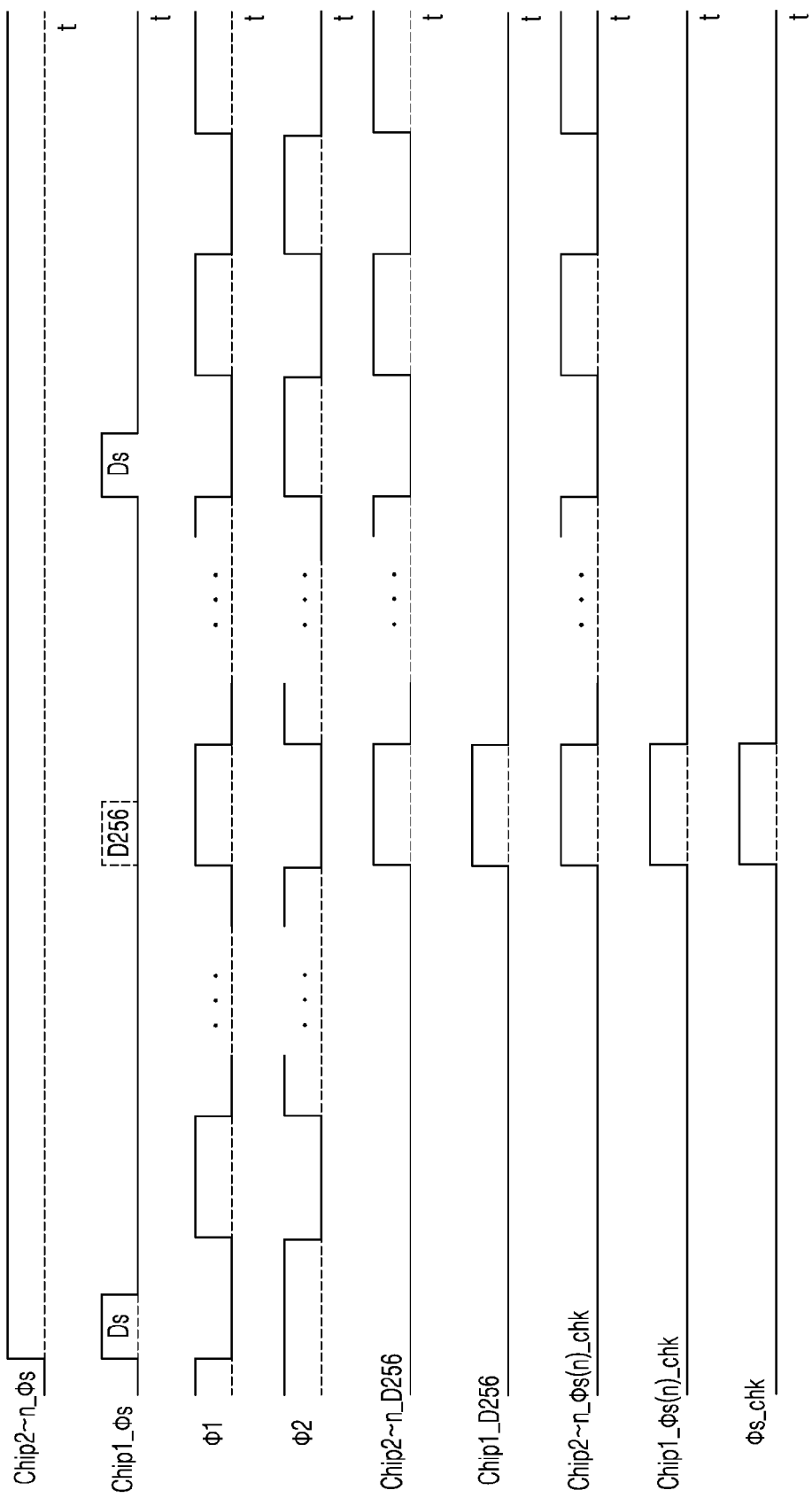
FIG. 15 is a timing diagram illustrating operations of the image forming apparatus of FIG. 12.

FIG. 15 is a timing diagram illustrating operations of the image forming apparatus 100 of FIG. 12. In detail, FIG. 15 is a timing diagram illustrating a signal applied and a signal measured to determine whether a first light-emitting element array chip from among the light-emitting array chips 125 is defective.

In order to check a first light-emitting element array chip, the control driver 110 may maintain a start signal at a high level for second to n-th light-emitting element array chips among the light-emitting element array chips 125. The control driver 110 input a single pulse signal to the first light-emitting element array chip as the start signal.

When a high level voltage is applied to a 256$^{th}$ diode of each of the second to n-th light-emitting element array chips, voltages of the ($\phi$s(2)_chk to the $\phi$s(n)_chk also have a high level. A level of a voltage measured at a check terminal may vary according to a level of a voltage of the ($\phi$s(1)_chk. When the voltage level of the ($\phi$s(1)_chk is high, the voltage level measured at the check terminal also is high. When the voltage level of the ($\phi$s(1)_chk is low, the voltage level measured at the check terminal also is low. Therefore, the control driver 110 may determine whether transfer elements of the first light-emitting element array chip are normal or defects according to the voltage level measured at the check terminal. In FIG. 15, since the voltage level of the $\phi$s(1)_chk is high, the voltage level measured at the check terminal is also high.

Figure 16:
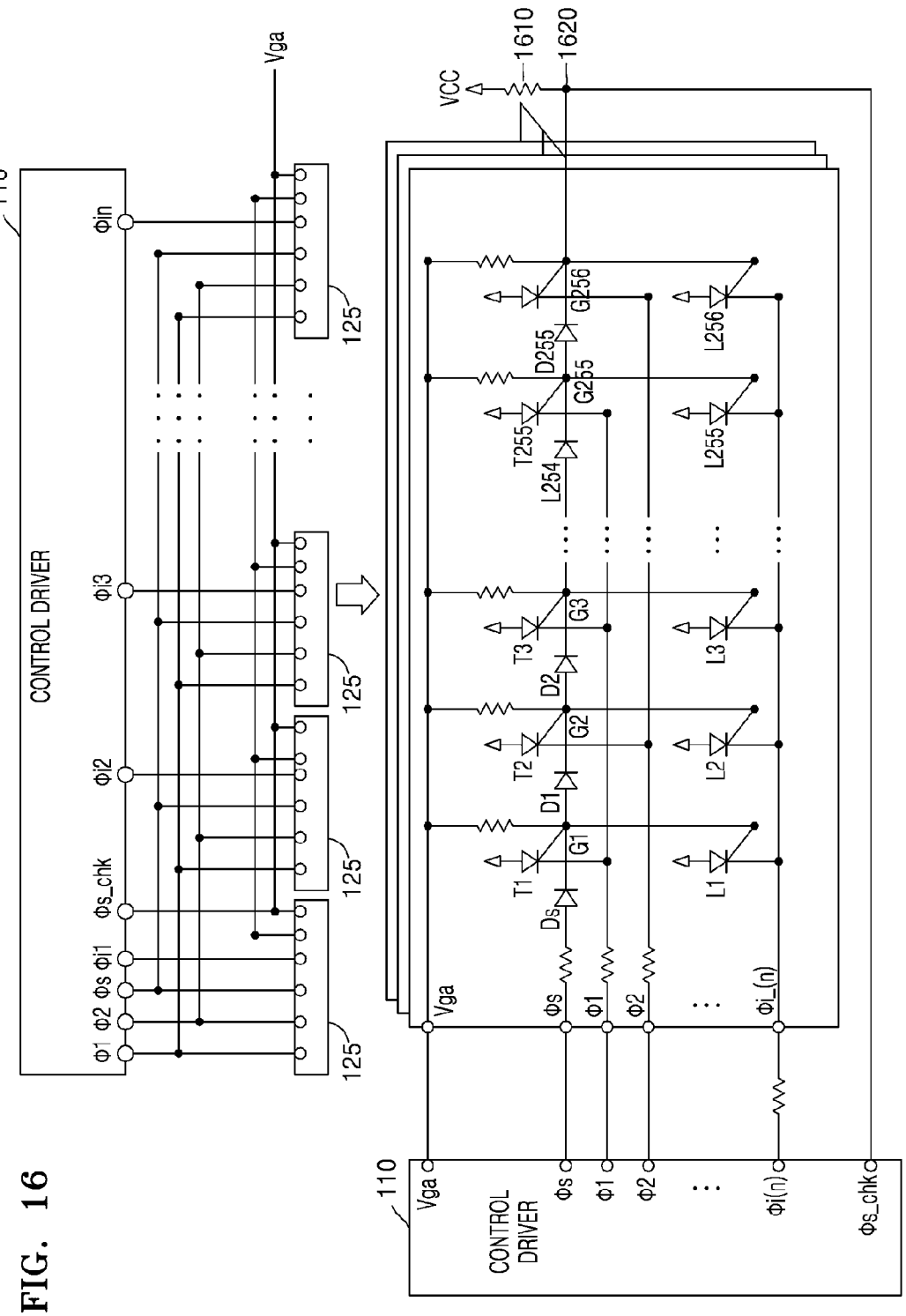
FIG. 16 is a diagram illustrating an image forming apparatus according to another exemplary embodiment.

FIG. 16 is a diagram illustrating the image forming apparatus 100 according to another exemplary embodiment. The image forming apparatus 100 determines whether one of the light-emitting element array chips 125 is defective by analyzing a voltage measured at a single check terminal ($\phi$s_chk). When one of the light-emitting element array chips 125 is defective, the image forming apparatus 100 determines which one of the light-emitting element array chips 125 is defective.

Referring to FIG. 16, the image forming apparatus 100 may include a pull-up resistor 1610, without including an inverse diode. Although the image forming apparatus 100 of FIG. 12 includes diode 1210, which is an inverse diode, in contrast, the image forming apparatus 100 of FIG. 16 includes only the pull-up resistor 1610. Although only the pull-up resistor 1610 is included, the image forming apparatus 100 of FIG. 16 operates in the same way as the image forming apparatus 100 of FIG. 12. Therefore, the description of FIG. 12 is also applied to the description of FIG. 16.

Figure 17:
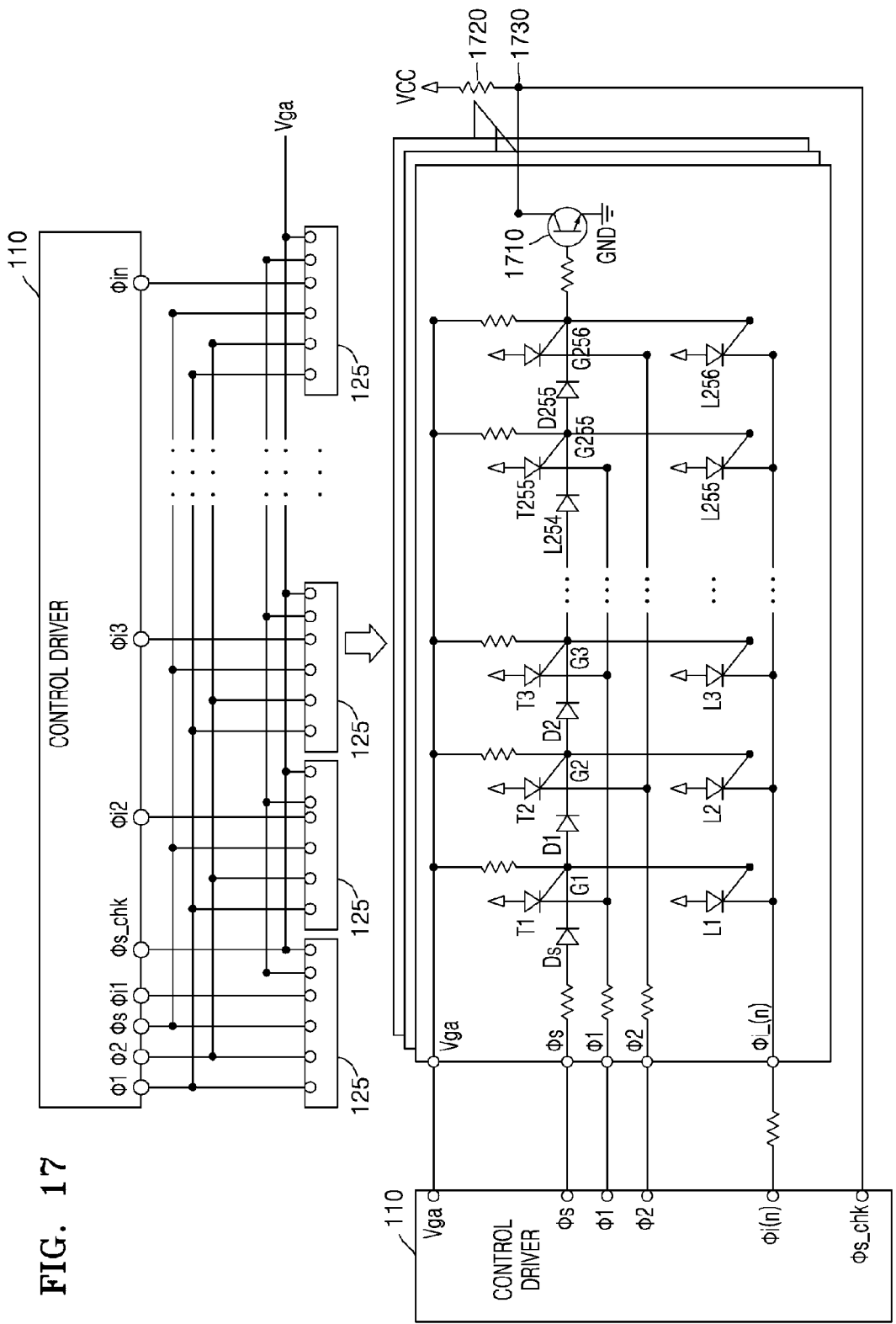
FIG. 17 is a diagram illustrating an image forming apparatus according to another exemplary embodiment.

FIG. 17 is a diagram illustrating the image forming apparatus 100 according to another exemplary embodiment. The image forming apparatus 100 may determine whether any of the light-emitting element array chips 125 are defective by analyzing a voltage measured at a single check terminal ($\phi$s_chk). When one of the light-emitting element array chips 125 is defective, the image forming apparatus 100 determines which one of the light-emitting element array chips 125 is defective. In detail, the image forming apparatus 100 determines a specific light-emitting element array chip 125 that includes a defective transfer element.

Referring to FIG. 17, in the image forming apparatus 100, each of the light-emitting element array chips 125 may include a transistor 1710 connected to a light-emitting element array. The image forming apparatus 100 may include a pull-up resistor 1720. A base of each of the transistors 1710 is connected to a gate G256 of a last transfer element. Collectors of the transistors 1710 are connected in parallel to the pull-up resistor 1720.

The control driver 110 may determine that a light-emitting element array chip among the light-emitting element array chips 125 includes a defective transfer element by applying a start signal to a light-emitting element array chip to be checked among the light-emitting element array chips 125. In order to determine whether a first light-emitting element array chip is defective, the control driver 110 does not apply a start signal to second to n-th light-emitting element array chips. The control driver 110 applies the start signal only to the first light-emitting element array chip. When transfer elements included in the first light-emitting element array chip are all normal, a high level voltage is transferred to the base of the transistor 1710. Therefore, the transistor 1710 operates, and current flows from a Vcc to emitters of the transistors 1710. Thus, a voltage of a node 1730 is low, and a low level voltage is detected at a check terminal.

Alternatively, when at least one selected from the transfer elements included in the first light-emitting element array chip is defective, voltage is not transferred to the base of the transistor 1710, and thus, the transistor 1710 does not operate. Current does not flow from the Vcc to the transistor 1710, and thus, the voltage of the node 1730 may be a voltage of the Vcc. Therefore, a high level voltage is measured at the check terminal.

Figures 18A, 18B:
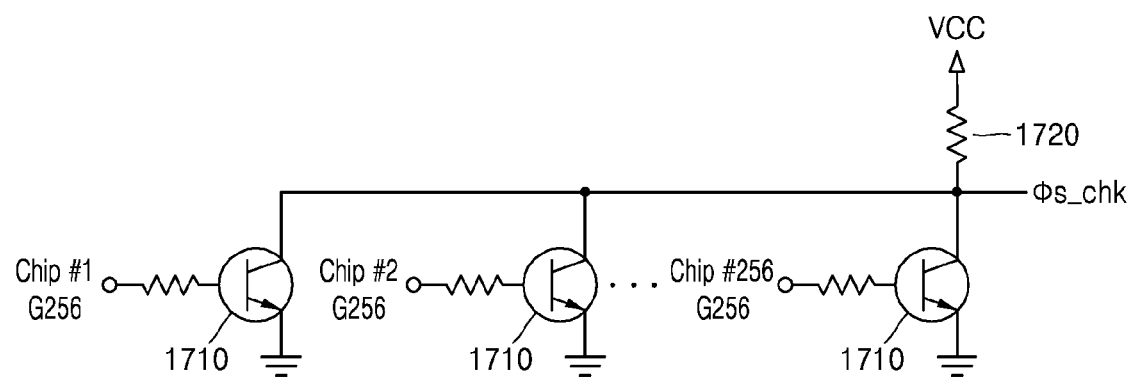
FIGS. 18A and 18B are diagrams illustrating a method of determining whether any of light-emitting element array chips are defective.

FIGS. 18A and 18B are diagrams illustrating a method of determining whether any of the light-emitting element array chips 125 are defective.

FIG. 18A is a table showing an example of testing a first light-emitting element array chip from among the light-emitting element array chips 125. Since a start signal is not applied to second to n-th light-emitting element array chips, transfer elements of second to n-th light-emitting element array chips do not operate.

In one case, a voltage of a gate G256 of a last transfer element of each of second to n-th light-emitting element array chips is low, and a voltage of a gate G256 of a last transfer element of the first light-emitting element array chip also is low. In this case, a high level voltage is measured at the check terminal, and the first light-emitting element array chip is defective. When at least one selected from the transfer elements included in the first light-emitting element array chip is defective, the start signal is not transferred to the last transfer element, and thus, the voltage of the gate G256 of the last transfer element of the first light-emitting element array chip is low.

In another case, the voltage of the gate G256 of the last transfer element of each of the second to n-th light-emitting element array chips is low, and the voltage of the gate G256 of the last transfer element of the first light-emitting element array chip is high. In this case, a low level voltage is measured at the check terminal, and the first light-emitting element array chip is normal. When the transfer elements of the first light-emitting element array chip are all normal, the voltage of the gate G256 of the last transfer element of the first light-emitting element array chip is high.

FIG. 18B illustrates a connection relationship between the transistors 1710 and the pull-up resistor 1720. The base of each of the transistors 1710 is connected to the gate G256 of the last transfer element. The collectors of the transistors 1710 are connected to the node 1730 in parallel. The pull-up resistor 1720 and the φs_chk are connected to the node 1730.

Figure 19:
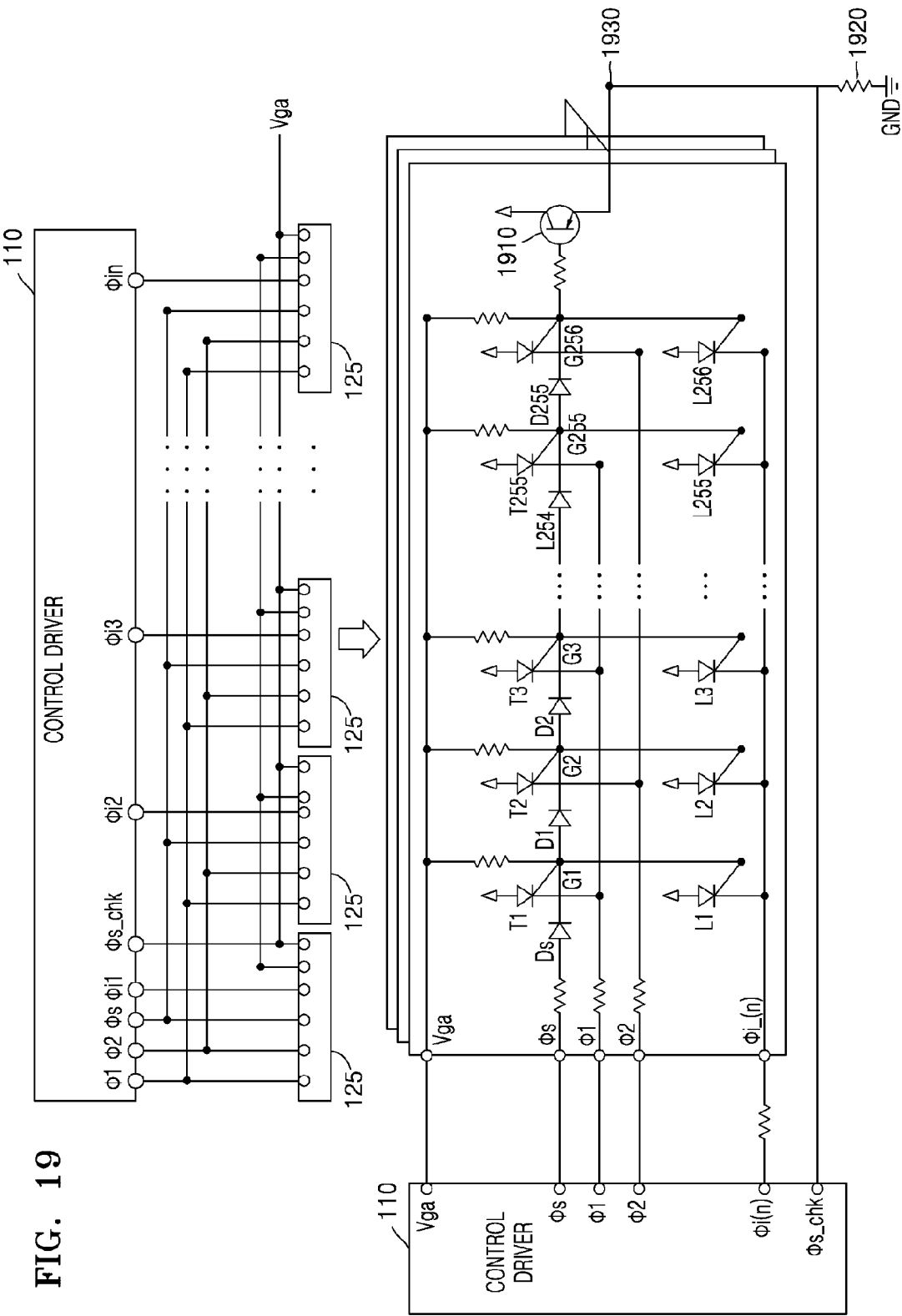
FIG. 19 is a diagram illustrating an image forming apparatus according to another exemplary embodiment.

FIG. 19 is a diagram illustrating the image forming apparatus 100 according to another exemplary embodiment. The image forming apparatus 100 includes a pull-down resistor 1920. Each of the light-emitting element array chips 125 includes a transistor 1910, and a base of each of the transistors 1910 is connected to a gate G256 of a last transfer element. Emitters of the transistors 1910 are connected in parallel and connected to the pull-down resistor 1920.

The image forming apparatus 100 of FIG. 19 determines whether any of the light-emitting element array chips 125 are defective similarly as the image forming apparatus 100 of FIG. 17. However, a connection form of the transistor 1910 is opposite to that of the transistor 1710 of the image forming apparatus 100 of FIG. 17. Therefore, the method of determining whether the light-emitting element array chips 125 are normal or defective based on a level of a voltage measured at a check terminal, as performed by the image forming apparatus 100 of FIG. 19, is opposite to that performed by the image forming apparatus 100 of FIG. 17.

Figures 20A, 20B:
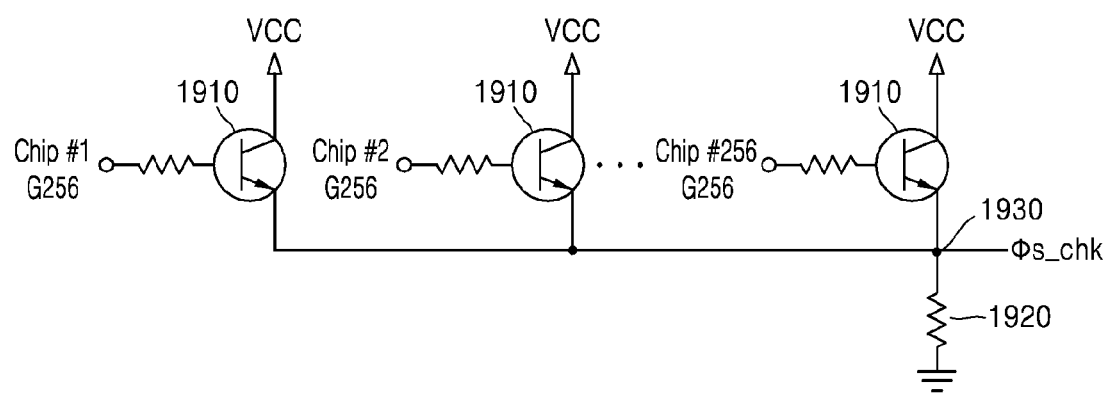
FIGS. 20A and 20B are diagrams illustrating a method of determining whether any of light-emitting element array chips are defective.

FIGS. 20A and 20B are diagrams illustrating a method of determining whether any of the light-emitting element array chips 125 are defective.

FIG. 20A is a table showing an example of testing a first light-emitting element array chip from among the light-emitting element array chips 125. Since a start signal is not applied to second to n-th light-emitting element array chips, transfer elements of the second to n-th light-emitting element array chips do not operate.

Suppose that a voltage of a gate G256 of a last transfer element of each of second to n-th light-emitting element array chips is low, and a voltage of a gate G256 of a last transfer element of the first light-emitting element array chip also is low. In this case, a low level voltage is measured at the check terminal and the first light-emitting element array chip is defective. When at least one selected from the transfer elements included in the first light-emitting element array chip is defective, the voltage of the gate G256 of the last transfer element of the first light-emitting element array chip is low.

In one case, the voltage of the gate G256 of the last transfer element of each of second to n-th light-emitting element array chips is low, and a voltage of the gate G256 of the last transfer element of the first light-emitting element array chip is high. In this case, a high level voltage is measured at the check terminal, and the first light-emitting element array chip is normal. When the transfer elements included in the first light-emitting element array chip are all normal, the voltage of the gate G256 of the last transfer element of the first light-emitting element array chip is high.

FIG. 20B illustrates a connection relationship between the transistors 1910 and the pull-down resistor 1920. The base of each of the transistors 1910 is connected to the gate G256 of the last transfer element. The emitters of the transistors 1910 are connected to a node 1930 in parallel. The pull-down resistor 1920 and the φs_chk are connected to the node 1930.

Figure 21:
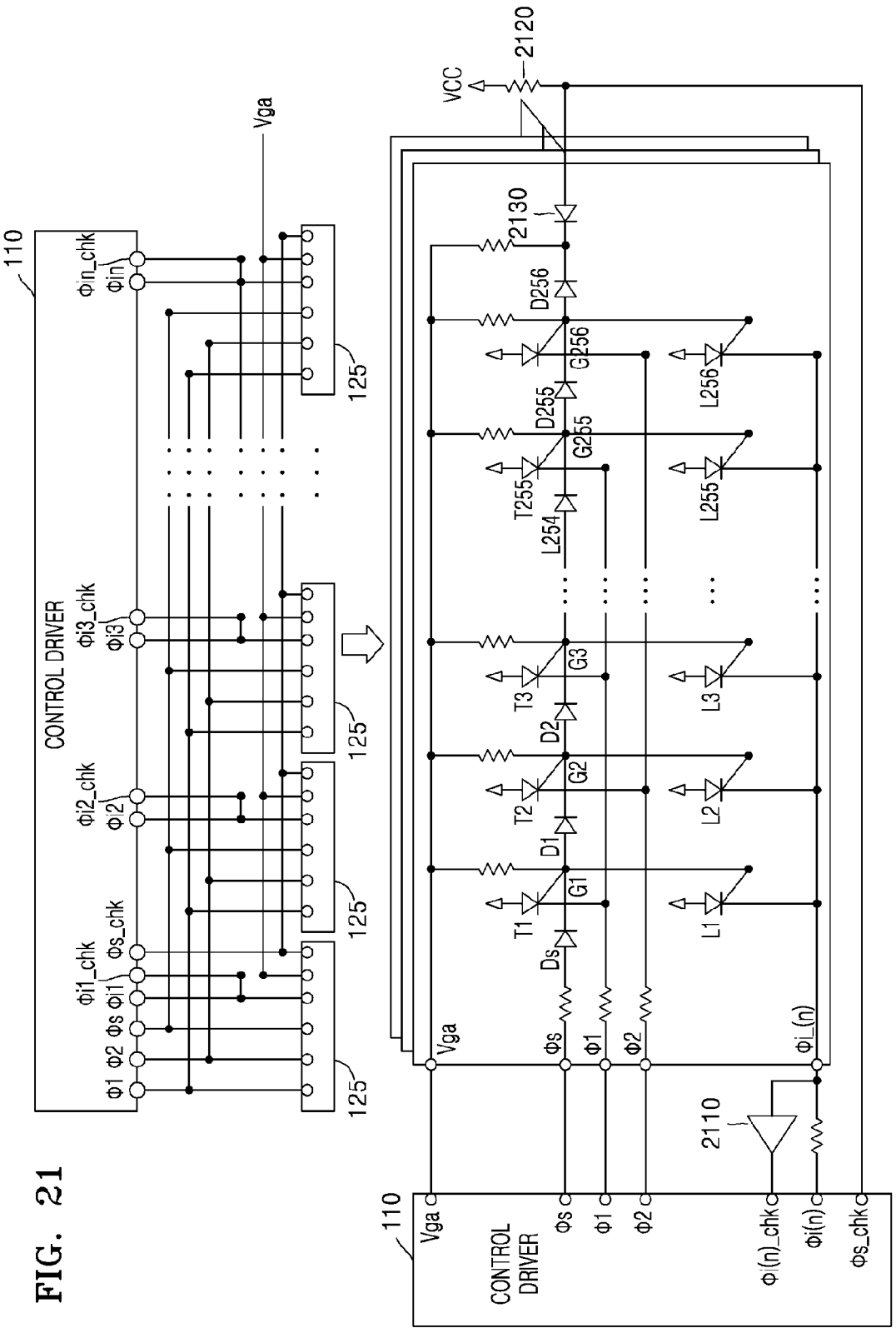
FIG. 21 is a diagram illustrating an image forming apparatus according to an exemplary embodiment.

FIG. 21 is a diagram illustrating the image forming apparatus 100 according to an exemplary embodiment. Referring to FIG. 21, the image forming apparatus 100 includes a buffer 2110 connected to the light-emitting element arrays 127. Also, the image forming apparatus 100 includes a pull-up resistor 2120 connected to the transfer element arrays 126. In the image forming apparatus 100, each of the light-emitting element array chips 125 includes a diode 2130 connected to the pull-up resistor 2120. Therefore, the image forming apparatus 100 may determine whether a defect is present in the light-emitting elements and the transfer elements.

Since the image forming apparatus 100 of FIG. 21 is a combination of the image forming apparatuses 100 shown in FIGS. 3 and 12, the defect is determined by using the same method as described with reference to FIGS. 3 and 12.

Figure 22:
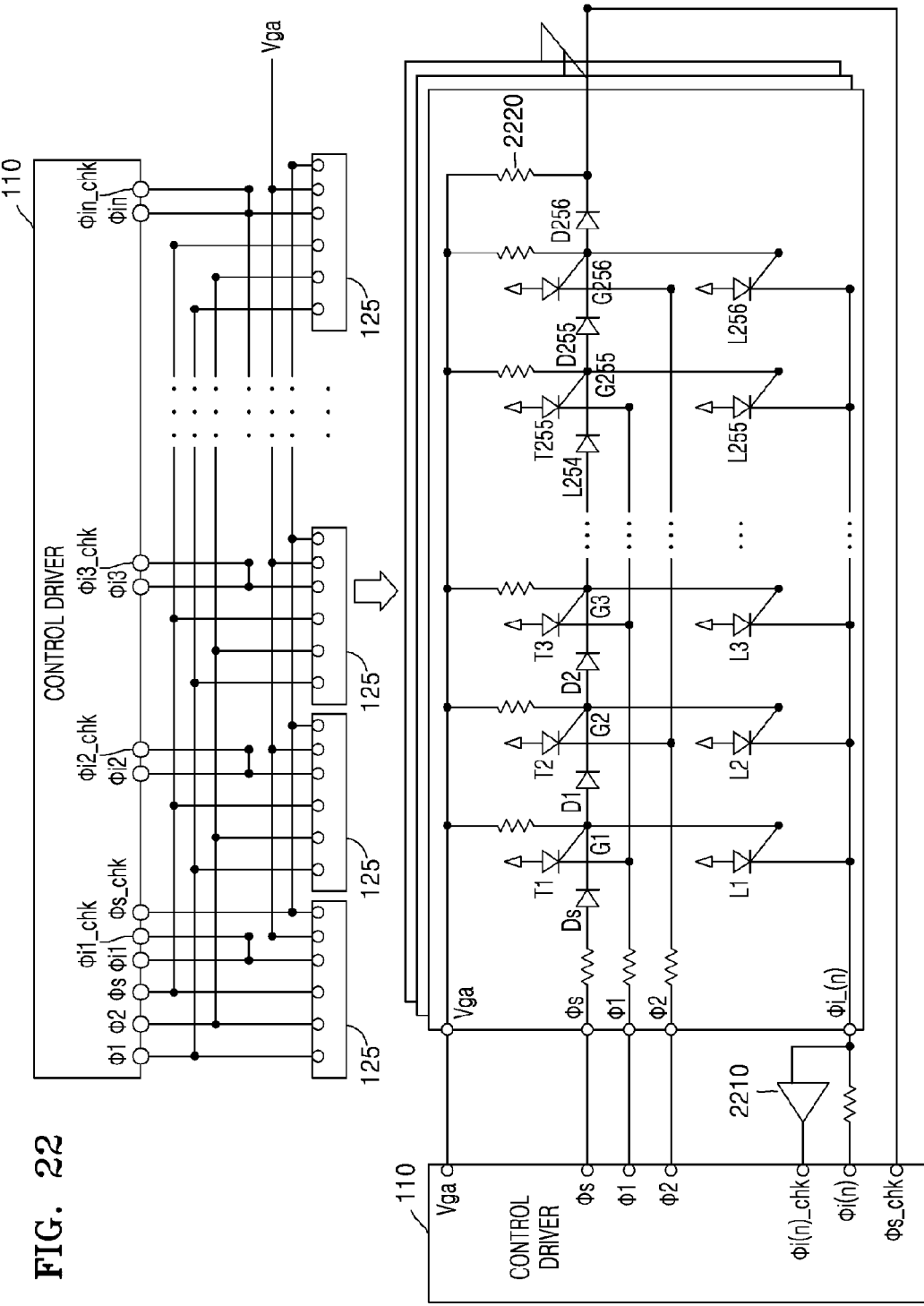
FIG. 22 is a diagram illustrating an image forming apparatus according to an exemplary embodiment.

FIG. 22 is a diagram illustrating the image forming apparatus 100 according to an exemplary embodiment. Referring to FIG. 22, the image forming apparatus 100 includes a buffer 2210 connected to the light-emitting element arrays 127, and each of the transfer element arrays 126 includes a pull-down resistor 2220. The transfer element arrays 126 are connected in parallel. Since the pull-down resistors 2220 are connected to a Vga, the pull-down resistors 2220 function in the same way as the OR gate. The control driver 110 may apply a signal to only a light-emitting element array chip to be checked from among the light-emitting element array chips 125, and measure a voltage via a check terminal when a $256^{th}$ transfer element T256 operates. If a high level voltage is measured at the check terminal, the light-emitting element array chips 125 to which the signal is applied are normal, and if not, the light-emitting element array chips 125 to which the signal is applied are defective.

The method of determining the defect of the light-emitting elements in the present example is the same as the method described with reference to FIG. 3.

Figure 23:
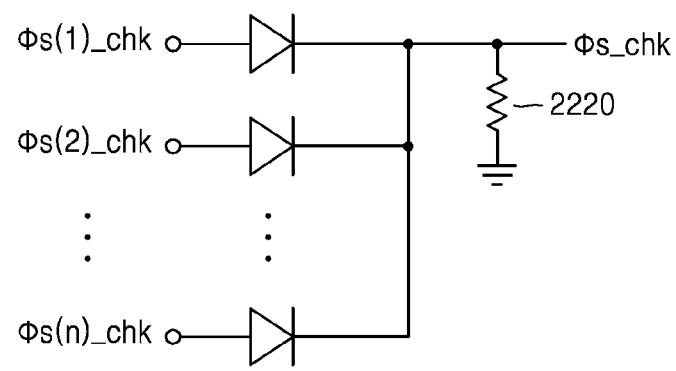
FIG. 23 is a diagram illustrating a connection relationship between diodes and a pull-down resistor.

FIG. 23 is a diagram illustrating a connection relationship between diodes and the pull-down resistor 2220. The diodes are connected between the check terminal (φs_chk) and a last transfer element of each of the light-emitting element array chips 125. The pull-down resistor 2220 is connected between the diodes that are connected to the check terminal in parallel. A high level voltage is applied to n terminals (φs(1)_chk to φs(n)_chk when the transfer element arrays 126 are normal. For example, when the transfer element arrays 126 of the first light-emitting element array chip are normal, the start signal is transferred from the first to $256^{th}$ transfer elements, and a high level voltage is applied to the terminal (φs(1)_chk when the start signal is transferred to the $256^{th}$ transfer element. When the high level voltage is applied to the terminal (φs(1)_chk, current flows to the pull-down resistor 2220 through a diode connected to the (φs(1)_chk. Therefore, a high level voltage is measured at the φs_chk.

Alternatively, when the transfer element arrays 126 of the first light-emitting element array chip are defective, the transfer of the start signal is stopped at a defective transfer element, and thus, a low level voltage is transferred to the (φs(1)_chk at a time point when the start signal would have been transferred to the $256^{th}$ transfer element (that is, voltage is not applied). When the (φs(1)_chk receives a low level voltage, current does not flow from the (φs(1)_chk to the pull-down resistor 2220. Therefore, a low level voltage is measured at the φs_chk.

Figure 24:
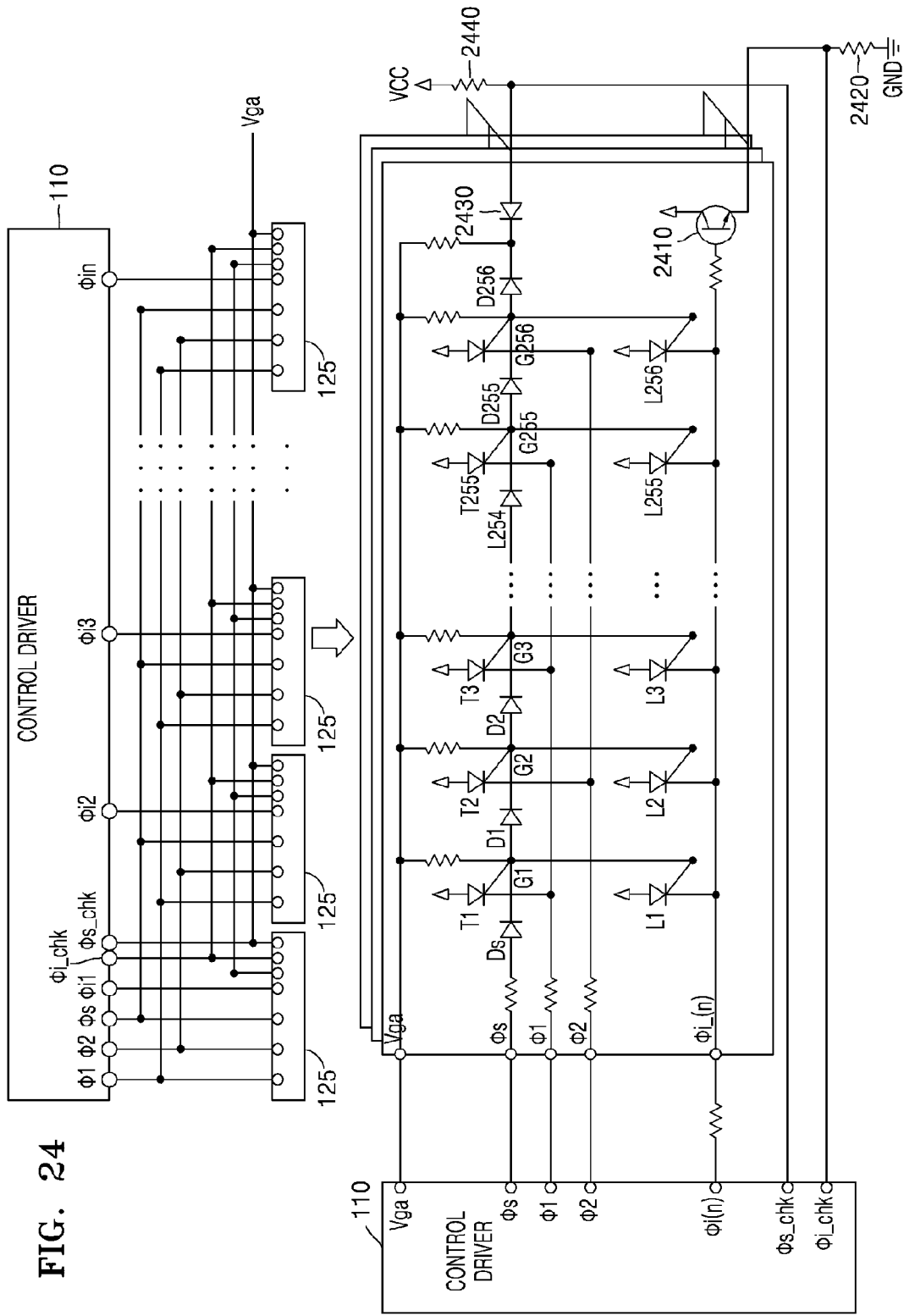
FIG. 24 is a diagram illustrating an image forming apparatus according to an exemplary embodiment.

FIG. 24 is a diagram illustrating the image forming apparatus 100 according to an exemplary embodiment. Referring to FIG. 24, in the image forming apparatus 100, each of the light-emitting element array chips 125 includes a transistor 2410 connected to light-emitting element arrays and a diode 2430 connected to transfer element arrays. A pull-down resistor 2420 is connected to the respective transistors 2410 of the light-emitting element array chips 125, and a pull-up resistor 2440 is connected to the respective diodes 2430 of the light-emitting element array chips 125.

Since the image forming apparatus 100 of FIG. 24 is a combination of the image forming apparatuses 100 shown in FIGS. 7 and 12, defects are determined by using the same method as described with reference to FIGS. 7 and 12.

Figure 25:
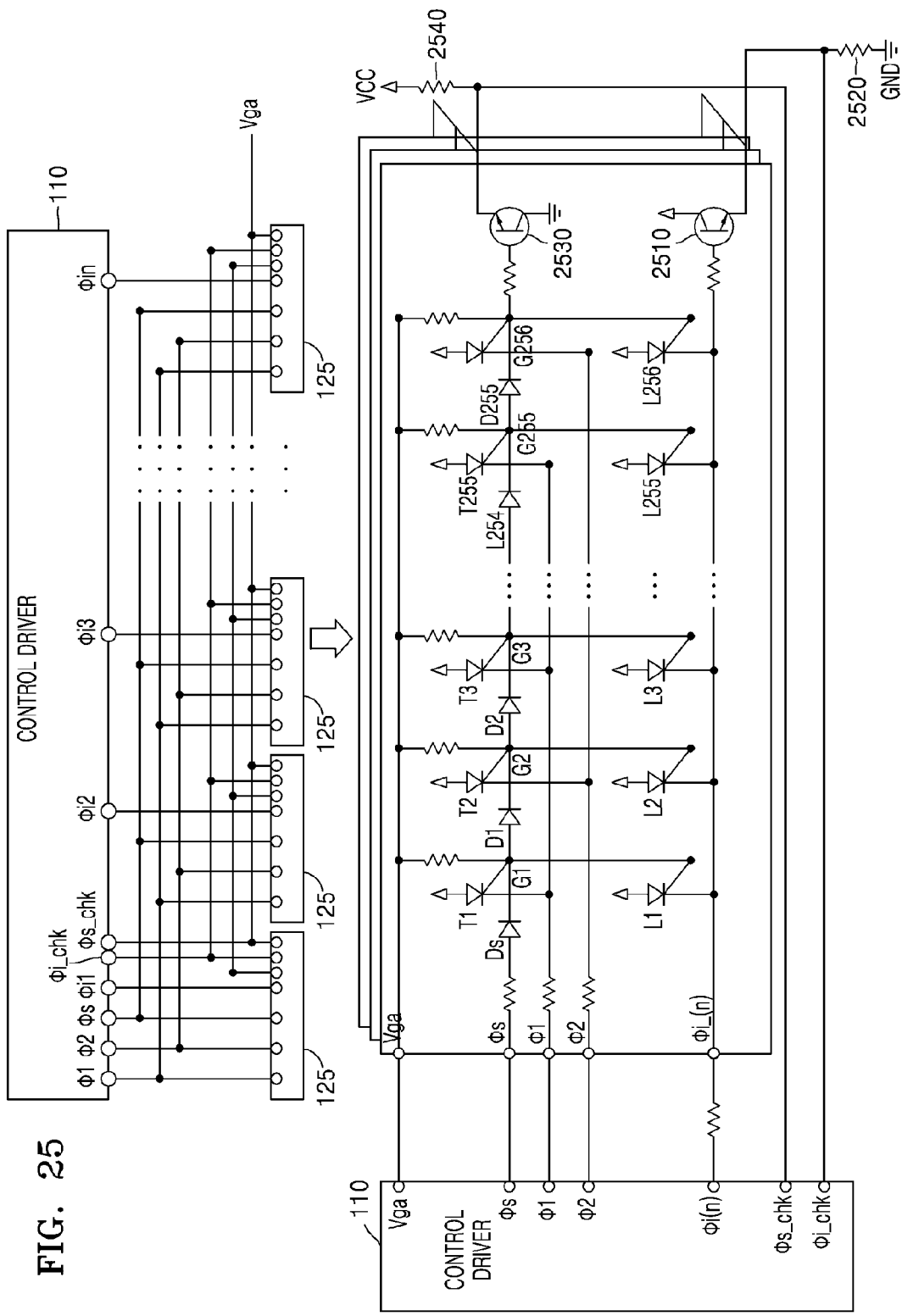
FIG. 25 is a diagram illustrating an image forming apparatus according to an exemplary embodiment.

FIG. 25 is a diagram illustrating the image forming apparatus 100 according to an exemplary embodiment. Referring to FIG. 25, in the image forming apparatus 100, each of the light-emitting element array chips 125 includes a transistor 2510 connected to light-emitting element arrays and a transistor 2530 connected to transfer element arrays. A pull-down resistor 2520 is connected to the respective transistors 2510 of the light-emitting element array chips 125, and a pull-up resistor 2540 is connected to the respective transistors 2530 of the light-emitting element array chips 125.

Since the image forming apparatus 100 of FIG. 25 is a combination of the image forming apparatuses 100 shown in FIGS. 7 and 17, defects are determined by using the same method as described with reference to FIGS. 7 and 17.

Figure 26:
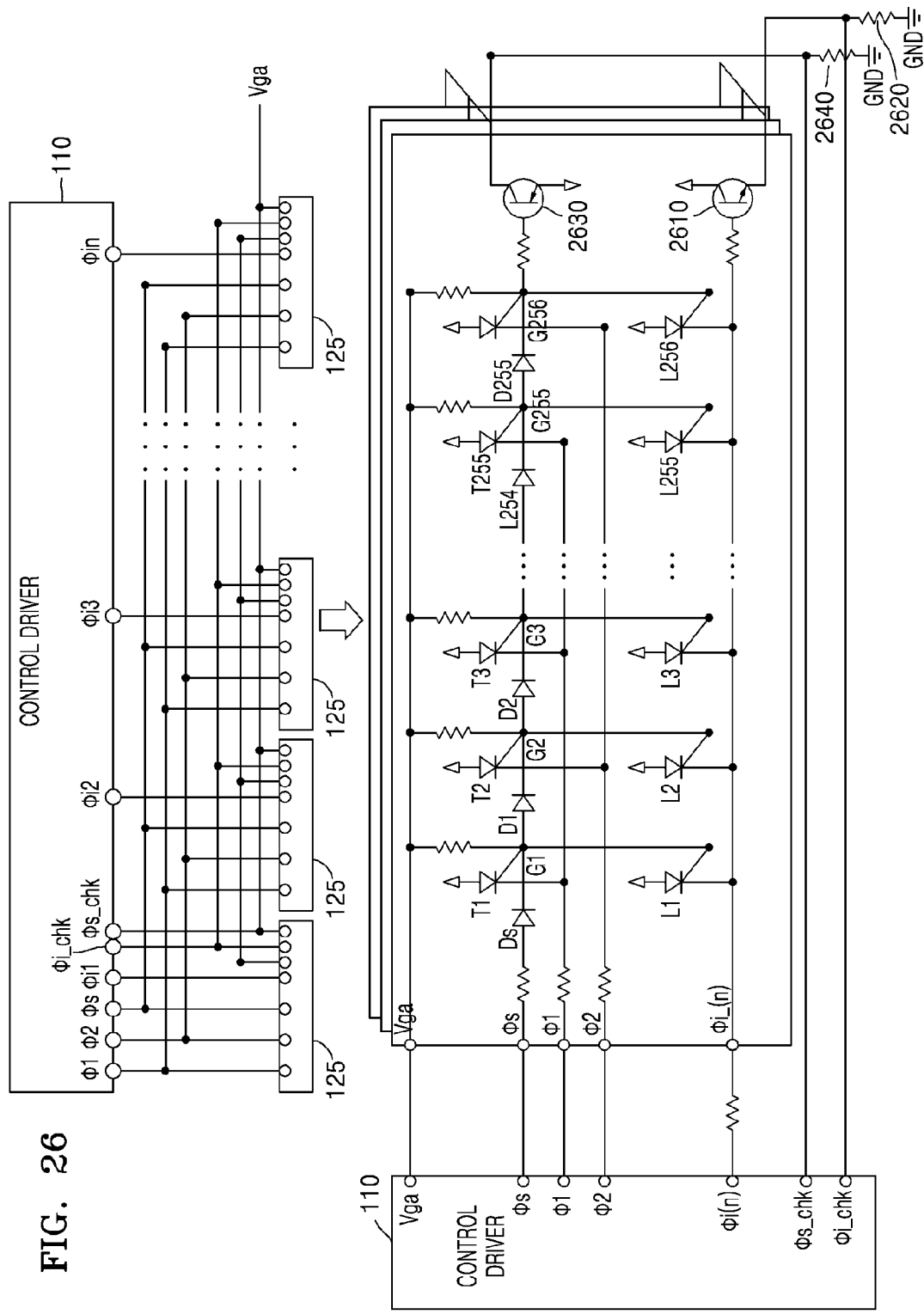
FIG. 26 is a diagram illustrating an image forming apparatus according to an exemplary embodiment.

FIG. 26 is a diagram illustrating the image forming apparatus 100 according to an exemplary embodiment. Referring to FIG. 26, in the image forming apparatus 100, each of the light-emitting element array chips 125 includes a transistor 2610 connected to light-emitting element arrays and a transistor 2630 connected to transfer element arrays. A pull-down resistor 2620 is connected to the respective transistors 2610 of the light-emitting element array chips 125, and a pull-down resistor 2640 is connected to the respective transistors 2630 of the light-emitting element array chips 125.

Since the image forming apparatus 100 of FIG. 26 is a combination of the image forming apparatuses 100 shown in FIGS. 7 and 19, defects are determined by using the same method as described with reference to FIGS. 7 and 19.

Figure 27:
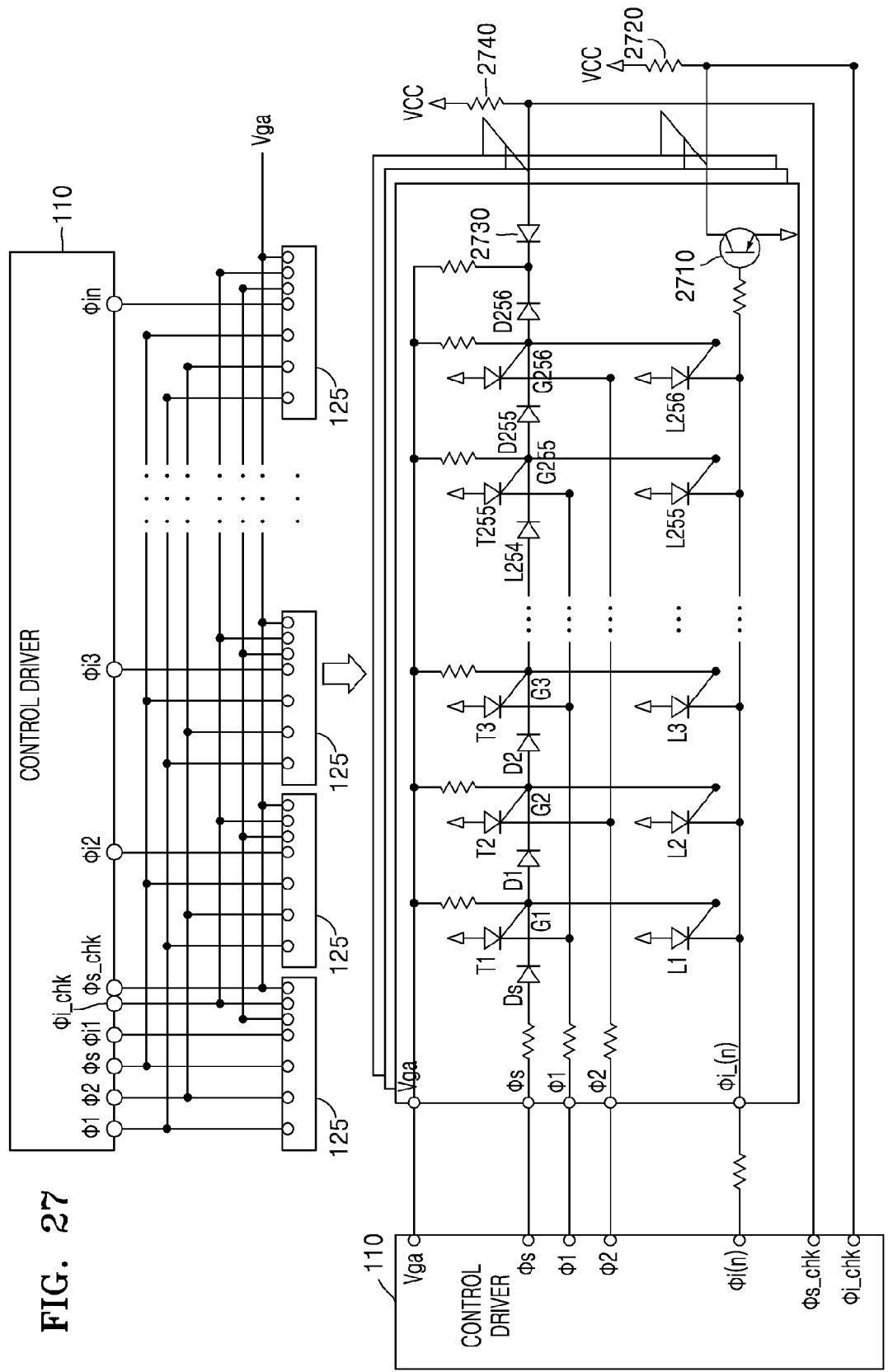
FIG. 27 is a diagram illustrating an image forming apparatus according to an exemplary embodiment.

FIG. 27 is a diagram illustrating the image forming apparatus 100 according to an exemplary embodiment. Referring to FIG. 27, in the image forming apparatus 100, each of the light-emitting element array chips 125 includes a transistor 2710 connected to light-emitting element arrays and a diode 2730 connected to transfer element arrays. A pull-up resistor 2720 is connected to the respective transistors 2710 of the light-emitting element array chips 125, and a pull-up resistor 2740 is connected to respective diodes 2730 of the light-emitting element array chips 125.

Since the image forming apparatus 100 of FIG. 27 is a combination of the image forming apparatuses 100 shown in FIGS. 9 and 12, defects are determined by using the same method as described with reference to FIGS. 9 and 12.

Figure 28:
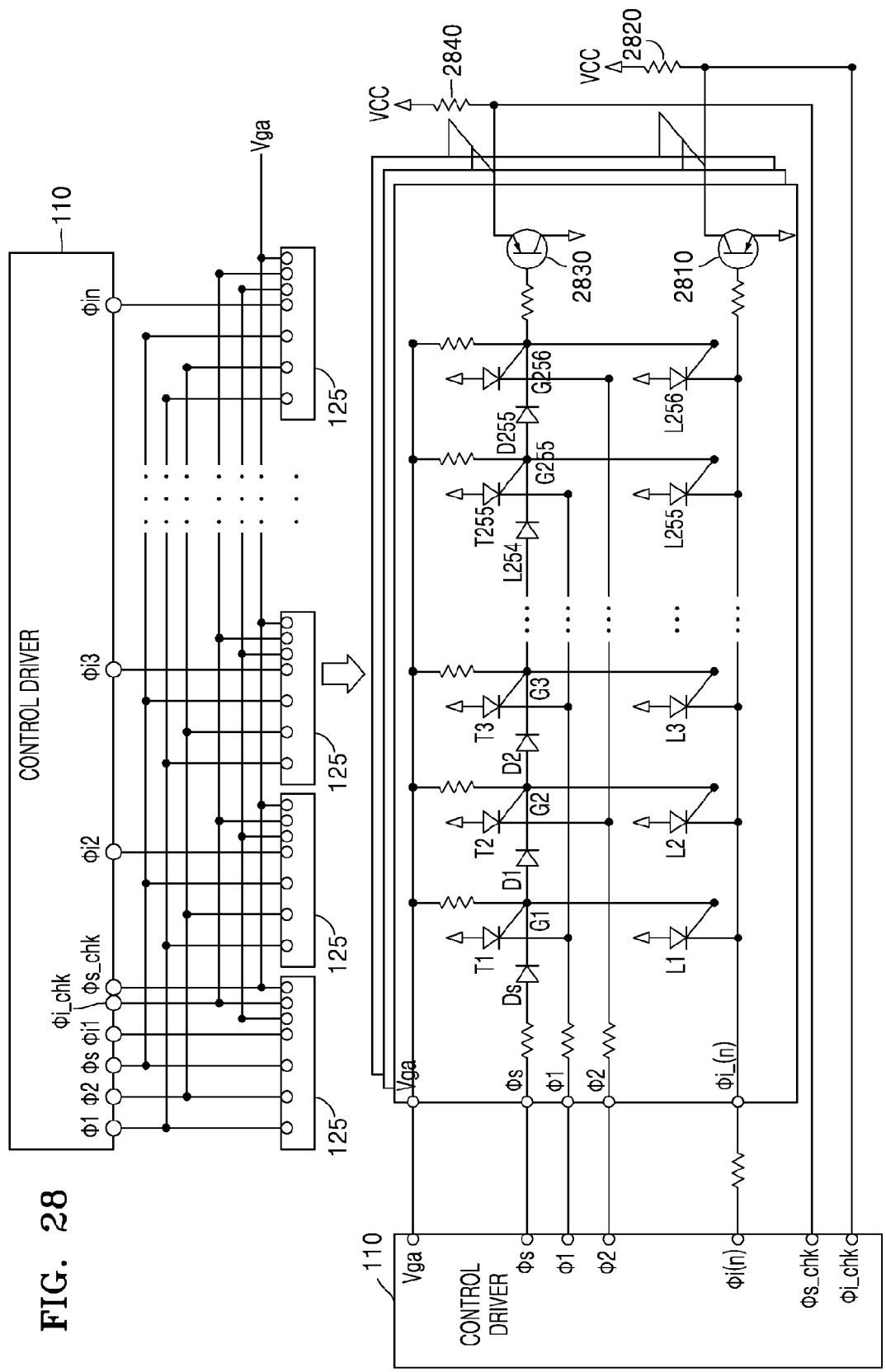
FIG. 28 is a diagram illustrating an image forming apparatus according to an exemplary embodiment.

FIG. 28 is a diagram illustrating the image forming apparatus 100 according to an exemplary embodiment. Referring to FIG. 28, in the image forming apparatus 100, each of the light-emitting element array chips 125 includes a transistor 2810 connected to light-emitting element arrays and a transistor 2830 connected to transfer element arrays. A pull-up resistor 2820 is connected to the respective transistors 2810 of the light-emitting element array chips 125, and a pull-up resistor 2840 is connected to the respective transistors 2830 of the light-emitting element array chips 125.

Since the image forming apparatus 100 of FIG. 28 is a combination of the image forming apparatuses 100 shown in FIGS. 9 and 17, defects are determined by using the same method as described with reference to FIGS. 9 and 17.

Although not described above, various combinations of the method of detecting whether a transfer element is defective and the method of detecting whether a light-emitting element is defective may be construed with respect to the embodiments of FIG. 28.

Figure 29:
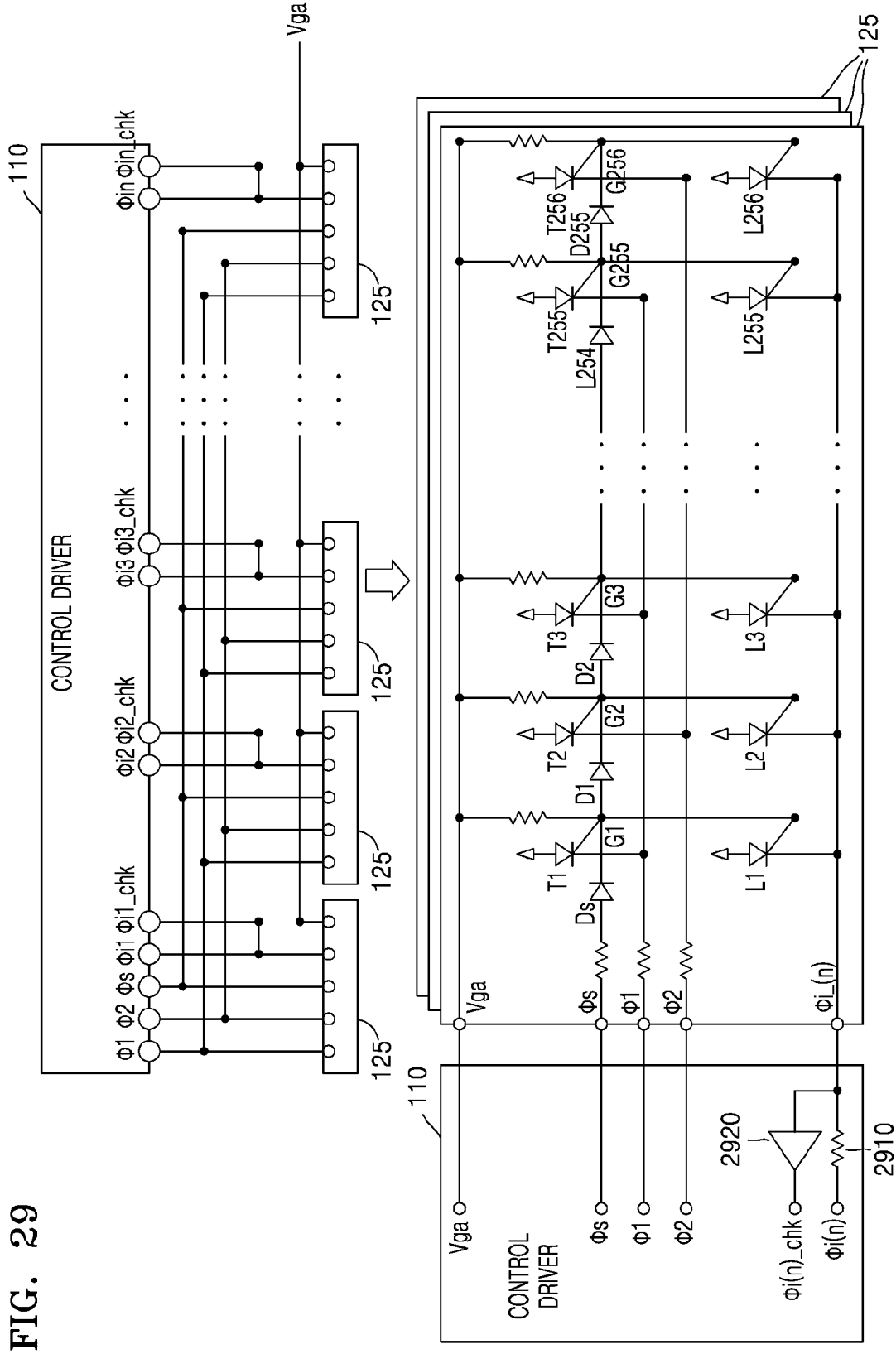
FIG. 29 is a diagram illustrating an image forming apparatus according to another exemplary embodiment.

FIG. 29 is a diagram illustrating the image forming apparatus 100 according to another exemplary embodiment. Referring to FIG. 29, the control driver 110 may include a buffer 2920 and a resistor 2910. Although FIG. 3 illustrates that the buffer 320 and the resistor 310 of the image forming apparatus 100 are connected between the control driver 110 and the light-emitting element array chips 125, FIG. 29 illustrates that the buffer 2920 and the resistor 2910 of the image forming apparatus 100 are included in the control driver 110. The image forming apparatus 100 of FIG. 29 is the same as the image forming apparatus 100 of FIG. 3 except that the control driver 110 includes the buffer 2920 and the resistor 2910.

Although not illustrated in FIG. 29, the control driver 110 may include not only the buffer 2910, but also, a comparing unit, a transistor, a diode, a pull-up resistor, or a pull-down resistor.

As described above, according to the one or more of the above exemplary embodiments, an image forming apparatus may determine a defective light-emitting element array chip from a plurality of light-emitting element array chips. The image forming apparatus may determine whether a transfer element or a light-emitting element is defective. The image forming apparatus may apply a signal to the transfer element or the light-emitting element, analyze an amplitude of a signal output from the transfer element or the light-emitting element, and thus determine the defective light-emitting element array chip.

The device described herein may include a processor, a memory for storing program data and executing it, a permanent storage unit such as a disk drive, a communication port for handling communications with external devices, and user interface devices, including a touch panel, keys, buttons, etc. When software modules or algorithms are involved, these software modules may be stored as program instructions or computer readable codes executable on a processor on a computer-readable medium. Examples of the computer readable recording medium include magnetic storage media (e.g., ROM, floppy disks, or hard disks), and optical recording media (e.g., CD-ROMs or DVDs). The computer readable recording medium can also be distributed over network coupled computer systems so that the computer readable code is stored and executed in a distributive manner. This media can be read by the computer, stored in the memory, and executed by the processor.

The inventive concept may be described in terms of functional block components and various processing steps. Such functional blocks may be realized by any number of hardware and/or software components configured to perform the specified functions. For example, the inventive concept may employ various integrated circuit (IC) components, e.g., memory elements, processing elements, logic elements, look-up tables, and the like, which may carry out a variety of functions under the control of one or more microprocessors or other control devices. Similarly, where the elements are implemented using software programming or software elements, the inventive concept may be implemented with any programming or scripting language such as C, C++, Java, assembler language, or the like, with the various algorithms being implemented with any combination of data structures, objects, processes, routines or other programming elements. Functional aspects may be implemented in algorithms that are executed on one or more processors. Furthermore, the inventive concept could employ any number of conventional techniques for electronics configuration, signal processing and/or control, data processing and the like. The words "mechanism," "element," "means," and "configuration" are used broadly and are not limited to mechanical or physical embodiments, but can include software routines in conjunction with processors, etc.

The particular implementations shown and described herein are illustrative examples of the inventive concept and are not intended to otherwise limit the scope of the inventive concept in any way. For the sake of brevity, conventional electronics, control systems, software development and other functional aspects of the systems may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device.

The use of the terms "a" and "an" and "the" and similar referents in the context of describing the inventive concept (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Also, the steps of all methods described herein can be performed in any suitable order unless otherwise indicated herein or otherwise clearly contradicted by context. The inventive concept is not limited to the described order of the steps. The use of any and all examples, or exemplary language (e.g., "such as") provided herein, is intended merely to better illuminate the inventive concept and does not pose a limitation on the scope of the inventive concept unless otherwise claimed. Numerous modifications and adaptations will be readily apparent to one of ordinary skill in the art without departing from the spirit and scope.

Although a few embodiments have been shown and described, it would be appreciated by those skilled in the art that changes may be made in these embodiments without departing from the principles and spirit of the disclosure, the scope of which is defined in the claims and their equivalents.

What is claimed is:

1. An image forming apparatus comprising:
    a plurality of light-emitting element array chips each comprising a light-emitting element array, a transfer element array, and a data line;
    a control driver including:
        a plurality of output terminals to output at least one signal to be applied to the plurality of light-emitting element array chips, and
        a check terminal to input at least one signal to analyze at least one signal output from the data line of the plurality of light-emitting element array chips based on the at least one applied signal, and to determine whether any of the plurality of light-emitting element array chips are defective by analyzing the at least one signal input at the check terminal;
    a resistor connected between an output terminal of the plurality of output terminals of the control driver and a terminal of the data line of the light-emitting element arrays; and
    a comparator connected between the check terminal of the control driver and the terminal of the data line of the light-emitting element arrays and in parallel with the resistor.

2. The image forming apparatus of claim 1, wherein the control driver applies a data signal to the data line such that all light-emitting elements included in the light-emitting element arrays emit light, and determines that one of the light-emitting element array chips is defective when a signal measured at the check terminal in response to the applied data signal is below a predetermined threshold value.

3. The image forming apparatus of claim 1, wherein the comparator compares a threshold value with a voltage measured from the data line, and outputs a result of the comparison to the check terminal.

4. The image forming apparatus of claim 1, wherein each of the plurality of light-emitting element array chips comprises a transistor connected to the data line of the light-emitting element arrays, and
    emitters of each of the transistors are connected in parallel, and each of the emitters is connected to the check terminal and to a pull-down resistor.

5. The image forming apparatus of claim 4, wherein the control driver applies a data signal such that all light-emitting elements comprised in a first light-emitting element array chip emit light, and applies a data signal such that light-emitting element array chips other than the first light-emitting element array chip do not operate, and
    determines that the first light-emitting element array chip is defective when a signal measured at the check terminal in response to the data signals is below a predetermined threshold value.

6. The image forming apparatus of claim 1, wherein each of the plurality of light-emitting element array chips comprises a transistor connected to the data line of the light-emitting element arrays, and collectors of the transistors are connected in parallel, and each of the collectors is connected to the check terminal and a pull-up resistor.

7. The image forming apparatus of claim 6, wherein the control driver applies a data signal such that all light-emitting elements comprised in a first light-emitting element array chip emit light, and applies a data signal such that light-emitting element array chips other than the first light-emitting element array chip do not operate, and determines that the first light-emitting element array chip is defective when a signal measured at the check terminal in response to the data signals is high.

8. The image forming apparatus of claim 1, wherein gates of last transfer elements comprised in the transfer element arrays are connected in parallel, and the image forming apparatus further comprises a pull-up resistor connected between the check terminal and the gates.

9. The image forming apparatus of claim 1, wherein each of the transfer element arrays comprises a diode, a cathode of the diode is connected to a cathode of a last diode of the transfer element arrays, and an anode of the diode is connected to the check terminal and a pull-up resistor.

10. The image forming apparatus of claim 1, wherein each of the transfer element arrays comprises a transistor, a base of the transistor is connected to a gate of a last transfer element of the transfer element arrays, and a collector of the transistor is connected to the check terminal and a pull-up resistor.

11. The image forming apparatus of claim 1, wherein each of the transfer element arrays comprises a transistor, a base of the transistor is connected to a gate of a last transfer element of the transfer element array, and an emitter of the transistor is connected to the check terminal and a pull-down resistor.

12. An image forming apparatus comprising:

a plurality of light-emitting element array chips each being comprised of light-emitting elements;

a control driver to determine whether any of the light-emitting elements are defective by sequentially applying a data signal in a different time slot to each of the light-emitting elements and including a check terminal to input a signal from the plurality of light-emitting element array chips during each of the different time slots and to measure the input signal;

a resistor connected between an output terminal of the control driver and a terminal of the plurality of light-emitting element array chips; and a comparator connected between the check terminal of the control driver and the terminal of the plurality of light-emitting element array chips and in parallel with the resistor.

13. The image forming apparatus of claim 12, wherein a light-emitting element corresponding to a particular time slot is determined as defective when the signal measured at the check terminal during the particular time slot is lower than a predetermined threshold.

14. The image forming apparatus of claim 12, wherein the plurality of light-emitting element array chips each further comprise a plurality of transfer elements, and wherein the control driver is configured to determine whether any of the plurality of transfer elements are defective by sequentially applying a second data signal in the different time slot to each of the plurality of transfer elements and by analyzing a second signal measured at the check terminal of the control driver during each of the different time slots.

15. A method of detecting a defect in any light-emitting elements comprised by a light-emitting element array chip of an image forming apparatus, the method comprising:

sequentially applying a data signal during a different time slot to each of the light-emitting elements;

analyzing, by way of a hardware-based control driver of the image forming apparatus including a resistor connected between an output terminal of the control driver and a terminal of light-emitting element array chip, and a comparator connected between a check terminal of the control driver and the terminal of light-emitting element array chip in parallel with the resistor, a signal input at the check terminal during each of the different time slots; and determining whether any of the light-emitting elements are defective based on the analyzing of the signal input during each of the different time slots.

16. The method of claim 15, wherein a light-emitting element of the plurality of light-emitting elements is determined as defective by comparing a signal measured during a corresponding time slot of the different time slots to a threshold voltage.

* * * * *